US009607688B2

(12) United States Patent
Kwak

(10) Patent No.: US 9,607,688 B2
(45) Date of Patent: Mar. 28, 2017

(54) MEMORY SYSTEM INCLUDING NONVOLATILE MEMORY AND MEMORY CONTROLLER AND PROGRAMMING METHOD FOR PROGRAMMING DATA INTO NONVOLATILE MEMORY

(71) Applicant: Donghun Kwak, Hwaseong-si (KR)

(72) Inventor: Donghun Kwak, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 190 days.

(21) Appl. No.: 14/526,661

(22) Filed: Oct. 29, 2014

(65) Prior Publication Data

US 2015/0213895 A1 Jul. 30, 2015

(30) Foreign Application Priority Data

Jan. 28, 2014 (KR) ........................ 10-2014-0010629

(51) Int. Cl.
  *G11C 11/56* (2006.01)
  *G11C 16/10* (2006.01)
  *G06F 12/02* (2006.01)
  *G06F 12/0868* (2016.01)

(52) U.S. Cl.
  CPC ...... *G11C 11/5628* (2013.01); *G06F 12/0246* (2013.01); *G06F 12/0868* (2013.01); *G11C 11/5621* (2013.01); *G11C 16/10* (2013.01); *G06F 2212/7207* (2013.01)

(58) Field of Classification Search
  CPC . G11C 16/10; G06F 12/0868; G06F 12/0246; G06F 2212/7207
  See application file for complete search history.

(56) References Cited

U.S. PATENT DOCUMENTS

| 5,603,041 | A | 2/1997 | Carpenter et al. |
| 5,712,818 | A | 1/1998 | Lee et al. |
| 7,061,813 | B2 | 6/2006 | Lee |
| 7,158,421 | B2 | 1/2007 | Li et al. |
| 7,206,230 | B2 | 4/2007 | Li et al. |
| 7,310,275 | B2 | 12/2007 | Cha |
| 7,502,260 | B2 | 3/2009 | Li |
| 8,223,550 | B2 | 7/2012 | Takeuchi |
| 8,570,801 | B2 * | 10/2013 | Lim ............... G11C 11/5628 365/185.03 |

(Continued)

*Primary Examiner* — Tuan T Nguyen
*Assistant Examiner* — Ajay Ojha
(74) *Attorney, Agent, or Firm* — Harness, Dickey & Pierce, P.L.C.

(57) ABSTRACT

According to example embodiments, a nonvolatile memory includes a plurality of memory cells and a plurality of bit lines respectively connected to the plurality of memory cells, and a method of programming the nonvolatile memory includes loading data to the nonvolatile memory for a first program operation, starting the first program operation on the plurality of memory cells, based on the loaded data, and loading at least two page data to the nonvolatile memory before the first program operation is completed. The at least two page data include first page data and second page data for a second program operation following the first program operation. The first page data and the second page data respectively correspond to a first bit and a second bit to be programmed at a memory cell among the plurality of memory cells.

20 Claims, 27 Drawing Sheets

(56) References Cited

U.S. PATENT DOCUMENTS

| | | | |
|---|---|---|---|
| 2002/0126531 A1* | 9/2002 | Hosono | G11C 11/5621 |
| | | | 365/185.17 |
| 2006/0013045 A1 | 1/2006 | Lee | |
| 2006/0181924 A1 | 8/2006 | Cha | |
| 2006/0221697 A1 | 10/2006 | Li et al. | |
| 2006/0233026 A1 | 10/2006 | Li | |
| 2010/0074011 A1* | 3/2010 | Kang | G11C 11/5628 |
| | | | 365/185.03 |
| 2010/0271882 A1 | 10/2010 | Takeuchi | |
| 2012/0120735 A1 | 5/2012 | Kubouchi et al. | |
| 2012/0203959 A1 | 8/2012 | Yoon et al. | |
| 2013/0132644 A1* | 5/2013 | Choi | G06F 12/0246 |
| | | | 711/103 |
| 2013/0176783 A1* | 7/2013 | Senoo | G11C 16/20 |
| | | | 365/185.09 |

\* cited by examiner

MEMORY SYSTEM INCLUDING NONVOLATILE MEMORY AND MEMORY CONTROLLER AND PROGRAMMING METHOD FOR PROGRAMMING DATA INTO NONVOLATILE MEMORY

CROSS-REFERENCE TO RELATED APPLICATIONS

A claim for priority under 35 U.S.C. §119 is made to Korean Patent Application No. 10-2014-0010629 filed Jan. 28, 2014, in the Korean Intellectual Property Office, the entire contents of which are hereby incorporated by reference.

BACKGROUND

The present disclosure relates to a semiconductor memory, and more particularly to a memory system including a nonvolatile memory and a memory controller and a method of programming data at the nonvolatile memory.

A semiconductor memory device may be fabricated using semiconductors such as, but not limited to, silicon (Si), germanium (Ge), gallium arsenide (GaAs), indium phosphide (InP), and the like. Semiconductor memory devices may be classified into volatile memory devices and nonvolatile memory devices.

The volatile memory devices may lose contents stored therein at power-off. The volatile memory devices include a static RAM (SRAM), a dynamic RAM (DRAM), a synchronous DRAM (SDRAM), and the like. The nonvolatile memory devices may retain stored contents even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like.

Electronic devices, such as, but not limited to, a computer, a smart phone, and a smart pad may use semiconductor memories. As the size of contents used in an electronic device increases, there increases the number of operations of programming data in the semiconductor memory under a control of the electronic device. For example, an image file may be stored in the semiconductor memory through one program operation, but a mass moving picture file may be stored in the semiconductor memory through a plurality of program operations. As the number of program operations increases, an operating speed of the semiconductor memory may depend on a delay time between program operations. Thus, a technique for reducing a delay time between program operations may be desired.

SUMMARY

According to example embodiments, a method of programming a nonvolatile memory is provided. The nonvolatile memory includes a plurality of memory cells and a plurality of bit lines respectively connected to the plurality of memory cells. The method includes loading data to the nonvolatile memory for a first program operation; starting the first program operation on the plurality of memory cells, based on the loaded data; and loading at least two page data to the nonvolatile memory before the first program operation is completed. The at least two page data include first page data and second page data for a second program operation following the first program operation. The first page data and the second page data respectively correspond to a first bit and a second bit to be programmed at a memory cell among the plurality of memory cells.

In example embodiments, the nonvolatile memory further may further include a plurality of first data latches respectively connected to the plurality of bit lines, a plurality of second data latches respectively connected to the plurality of bit lines, and a plurality of cache latches respectively connected to the plurality of bit lines. The loading data to the nonvolatile memory for a first program operation may include loading the data to the plurality of cache latches, and dumping the data loaded onto the cache latches onto the first data latches.

In example embodiments, the starting the first program operation may be performed based on the data dumped onto the first data latches.

In example embodiments, the loading at least two page data may include loading the first page data onto the cache latches during the first program operation; and dumping the first page data loaded onto the cache latches onto the second data latches.

In example embodiments, the loading at least two page data may further include loading the second page data onto the cache latches after the first page data is dumped onto the second data latches.

In example embodiments, the method may further include dumping the second page data loaded onto the cache latches onto the first data latches after the first program operation is ended; and after the second page data is dumped onto the first data latches, starting the second program operation based on the second page data dumped onto the first data latches and the first page data dumped onto the second data latches.

In example embodiments, the nonvolatile memory may further include a plurality of third data latches respectively connected to the plurality of bit lines and a plurality of fourth data latches respectively connected to the plurality of bit lines. The loading the at least two page data may further include loading the first page data onto the cache latches during the first program operation, dumping the first page data loaded onto the cache latches onto the fourth data latches, loading the second page data onto the cache latches during the first program operation, and dumping the second page data loaded onto the cache latches onto the third data latches during the first program operation.

In example embodiments, the method may further include after the first program operation ends, starting the second program operation based on the second page data dumped onto the third data latches and the first page data dumped into the fourth data latches.

In example embodiments, the nonvolatile memory may further include a plurality of third data latches respectively connected to the plurality of bit lines. The loading at least two page data may further include loading the first page data onto the cache latches and dumping the first page data loaded onto the cache latches onto the second data latches before the first program operation ends, loading the second page data onto the cache latches before the first program operation ends, dumping the second page data loaded onto the cache latches onto the third data latch before the first program operation ends, loading the third page data for the second program operation onto the cache latches before the first program operation ends, and dumping the third page data loaded onto the cache latches onto the first data latches after the first program operation ends. The method may further comprise after the third page data is dumped, the method may further include starting the second program operation based on the third page data loaded onto the first data latches, the first page data dumped into the second data latches, and the second page data dumped into the third data latches.

According to example embodiments, a memory system includes a nonvolatile memory including a plurality of memory cells, a plurality of data latches respectively connected to the plurality of bit lines, and a plurality of cache latches corresponding to the plurality of bit lines, and a memory controller. The memory controller is configured to transmit data to be programmed at the memory cells and to control the nonvolatile memory such that the data is programmed at the memory cells. The memory controller is configured to select one of a normal mode and a dump mode. During the normal mode, the memory controller is configured to transmit page data for a second program operation following a first program operation of the memory cells to the nonvolatile memory. During the dump mode, the memory controller is configured to transmit the page data for the second program operation to the nonvolatile memory together with a dump command. The nonvolatile memory is configured to store the page data received from the memory controller in the cache latches and to dump the page data stored in the cache latches onto the data latches when the dump command is received from the memory controller.

In example embodiments, the plurality of memory cells may include first memory cells and second memory cells, the memory controller may be configured to program I bits at each of the first memory cells of the plurality of memory cells and J bits at each of the second memory cells of the plurality of memory cells. I and J may be integers. J may be less the I. The memory controller may be configured to select the normal mode when the first program operation is performed at the first memory cells and to select the dump mode when the first program operation is performed at the second memory cells.

In example embodiments, the nonvolatile memory may include a plurality of memory blocks, the first memory cells may be included in a first memory blocks of the plurality of memory blocks, the second memory cells may be included in a second memory blocks of the plurality of memory blocks, and the nonvolatile memory may be configured to be erased by a unit of memory block.

In example embodiments, the memory controller may be configured to select the normal mode when the data latches connected to the plurality of bit lines do not include at least one data latch in which data is not stored during the first program operation, and the memory controller may be configured to select the dump mode when the data latches connected to the plurality of bit lines do not include at least one data latch in which data is not stored during the first program operation.

In example embodiments, the nonvolatile memory may have a plurality of dump points during the first program operation, and when the dump command is received from the memory controller during the first program operation, the nonvolatile memory may dump the page data stored in the cache latches onto the data latches at a dump point being the first to arrive.

In example embodiments, the plurality of dump points may be points among a plurality of program loops of the programming, and in each program loop, a verification voltage may be applied after a program voltage is applied to the plurality of memory cells.

According to example embodiments, a method of programming a nonvolatile memory is provided. The nonvolatile memory includes a plurality of memory cells connected to a page buffer circuit through a plurality of bit lines, respectively. The method includes loading at least one page data for an upcoming program operation to the page buffer circuit; starting the upcoming program operation, the upcoming program operation including transferring the at least one page data for the upcoming program operation loaded onto the page buffer circuit to the plurality of memory cells; and loading at least two page data for a following program operation to the page buffer circuit. The loading the at least two page data for the following program operation including loading first page data and second page data for the following program operation to the page buffer circuit before the upcoming program operation is completed. The following program operation is scheduled for after the upcoming program operation. The first page data and the second page data for the following program operation respectively corresponding to a first bit and a second bit to be programmed in at least one of the plurality of memory cells.

In example embodiments, the page buffer circuit includes a plurality of page buffers connected to the plurality of bit lines, respectively. Each page buffer includes a cache latch connected to a plurality of data latches. The loading the at least one page data for the upcoming program operation to the page buffer circuit includes loading each bit of the at least one page data for the upcoming program operation to the cache latch of each page buffer and dumping each bit of the at least one page data for the upcoming program operation from the cache latch onto one of the data latches in each page buffer before the starting the upcoming program operation. The loading the at least two page data for the following program operation further includes loading each bit of the first page data for the following program operation to the cache latch of each page buffer after starting the upcoming program operation and before the upcoming program operation is completed.

In example embodiments, the method may further include determining whether a free data latch exists in the plurality of data latches in each page buffer before the upcoming program operation is completed. If the free data latch exists, the loading the at least one page of data for the following program operation may further include, dumping each bit of the loaded first page data for the following program operation from the cache latch onto the free data latch in each page buffer before the upcoming program operation is completed, and loading each bit of the second page data for the following program operation to the cache latch of each page buffer after the dumping each bit of the loaded first page data for the following program operation and before the upcoming program operation is completed. If the free data latch does not exist, the loading the at least two page data for the following program operation further includes dumping each bit of the loaded first page of data for the following program operation from the cache latch onto one of the data latches in each page buffer after the upcoming program operation is completed, and the second page data for the following program operation may correspond to second bit to be programmed at one of the plurality of memory cells.

In example embodiments, the page buffer circuit may include a page buffer. The page buffer may include a cache latch and a plurality of data latches connected to each other. Before the starting the upcoming program operation, the loading the at least one page data for the upcoming program operation to the page buffer circuit includes loading third page data for the upcoming program operation to the cache latch, dumping the loaded third page data for the upcoming program operation from the cache latch onto one of the plurality of data latches, loading fourth page data for the upcoming program operation to the cache latch after the dumping the third page of data for the upcoming program operation, dumping the loaded fourth page data for the upcoming program operation from the cache latch onto a different one of the plurality of data latches. The method may further include determining whether a free data latch exists among the plurality of data latches after starting the upcoming program operation and before the upcoming program operation is completed. The loading the at least two page data for the following program operation may include loading the first page data for the following program operation to the cache latch after starting the upcoming program operation, and one of (i) if the free data latch exists, dumping the loaded first page data for the following program operation from the cache latch onto the free data latch before the upcoming program operation is completed, and (ii) if the free data latch does not exist, dumping the loaded first page data for the following program operation from the cache latch to a first available one of the plurality of data latches after the upcoming program operation is completed.

In example embodiments, the nonvolatile memory may include a plurality of strings arranged in rows and columns on a substrate. Each string may include a number of the plurality of memory cells stacked on top of each other between at least one ground selection transistor and at least one string selection transistor along a direction perpendicular to the substrate.

BRIEF DESCRIPTION OF THE FIGURES

The above and other features will become apparent from the following description of non-limiting embodiments, as illustrated in the following figures, wherein like reference numerals refer to like parts throughout the various figures unless otherwise specified. The drawings are not necessarily to scale, emphasis instead being placed upon illustrating principles of inventive concepts. In the drawings.

DETAILED DESCRIPTION

Figure 1:
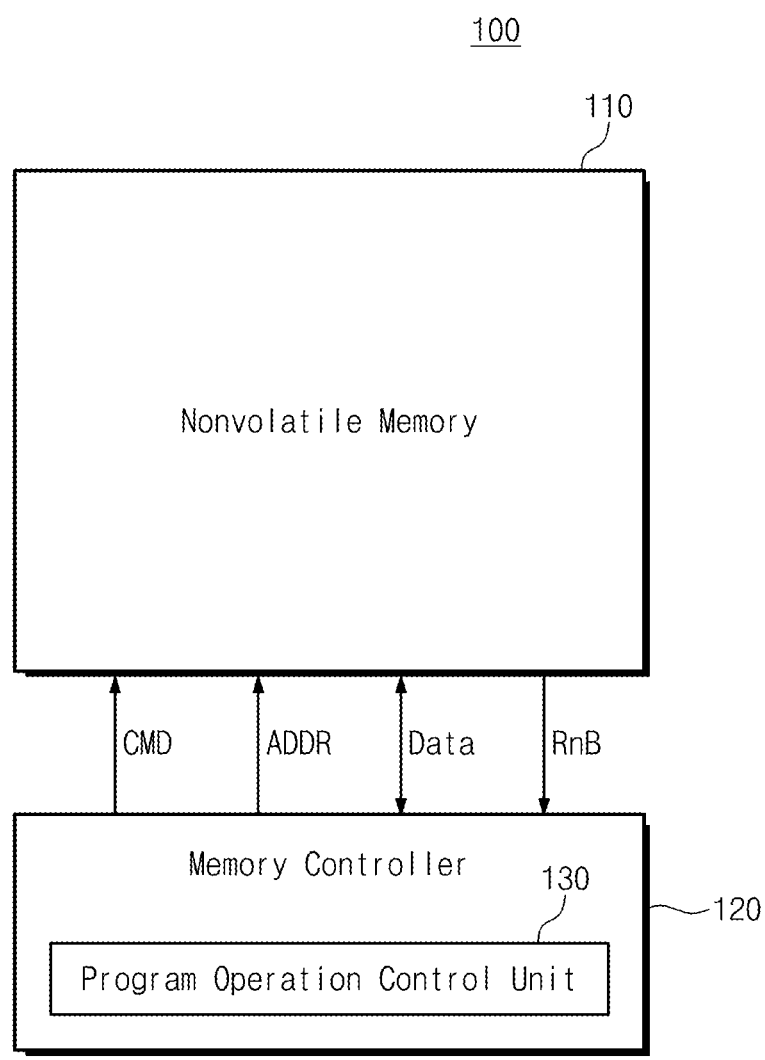
FIG. 1 is a block diagram schematically illustrating a memory system according to example embodiments.

Example embodiments will be described in detail with reference to the accompanying drawings, in which some example embodiments are shown. Inventive concepts, however, may be embodied in various different forms, and should not be construed as being limited only to the illustrated embodiments. Rather, these example embodiments are provided as examples so that this disclosure will be thorough and complete, and will fully convey the scope of inventive concepts to those skilled in the art. Unless otherwise noted, like reference numerals denote like elements throughout the attached drawings and written description, and thus descriptions will not be repeated. In the drawings, the sizes and relative sizes of layers and regions may be exaggerated for clarity. Like reference numerals in the drawings denote like elements, and thus their description may be omitted. Known processes, elements, and techniques may not be described with respect to example embodiments.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration. Expressions such as "at least one of," when preceding a list of elements, modify the entire list of elements and do not modify the individual elements of the list.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram schematically illustrating a memory system 100 according to example embodiments. Referring to FIG. 1, a memory system 100 includes a nonvolatile memory 110 and a memory controller 120.

The nonvolatile memory 110 receives a command CMD and an address ADDR from the memory controller 120. The nonvolatile memory 110 outputs a ready/busy signal RnB to the memory controller 120. The nonvolatile memory 110 exchanges data with the memory controller 120.

The command CMD may be a signal for ordering execution of a desired (and/or alternatively predetermined) operation. The nonvolatile memory 110 responds to the command CMD to perform a variety of operations such as, but not limited to, a read operation, a program operation, an erase operation, and so on. The address ADDR may be a signal for identifying storage spaces of the nonvolatile memory 110. The nonvolatile memory 110 performs an operation (e.g., reading, programming, or erasing), ordered by the command CMD, about a storage space identified by the address ADDR.

The ready/busy signal RnB may be a signal for indicating a state of the nonvolatile memory 110. When the ready/busy signal RnB indicates a busy state, the nonvolatile memory 110 may be at a state where it does not receive a control (e.g., command CMD and/or address ADDR) from the memory controller 120. For example, the nonvolatile memory 110 enters a busy state when the nonvolatile memory 110 is at a state where it is unable to receive the command CMD or the address ADDR from the memory controller 120 or where it is unable to exchange data with the memory controller 120.

The nonvolatile memory 110 may be under a control of the memory controller 120 when the ready/busy signal RnB has at a ready state, for example, has a high state. For example, the nonvolatile memory 110 enters the ready state at a state where it is able to receive the command CMD or the address ADDR from the memory controller 120 or where it is able to exchange data with the memory controller 120.

The memory controller 120 is configured to control the nonvolatile memory 110. The memory controller 120 transmits the command CMD and the address ADDR to the nonvolatile memory 110. The memory controller 120 exchanges data with the nonvolatile memory 110. The memory controller 120 receives the ready/busy signal RnB from the nonvolatile memory 110.

When the ready/busy signal RnB indicates a ready state, the memory controller 120 may issue the command CMD or the address ADDR to the nonvolatile memory 110. When the ready/busy signal RnB indicates a ready state, the memory controller 120 may transmit data to the nonvolatile memory 110 or receive data from the nonvolatile memory 110.

The memory controller 120 transmits a read command, a program command, or an erase command to the nonvolatile memory 110 for the nonvolatile memory 110 to perform a read operation, a program operation, or an erase operation.

The memory controller 120 includes a program operation control unit 130. The program operation control unit 130 controls a program operation of the nonvolatile memory 110. The program operation may contain an operation of loading data to be programmed onto the nonvolatile memory 110 and an operation of programming the loaded data at the nonvolatile memory 110. The program operation control unit 130 controls a program operation of the nonvolatile memory 110 by deciding data or the command CMD that the memory controller 120 transmits to the nonvolatile memory 110.

The program operation control unit 130 may set a program operation of the nonvolatile memory 110 to a normal mode or a dump mode. The program operation control unit 130 controls the memory controller 120 such that the memory controller 120 transmits the command CMD or data to the nonvolatile memory 110 according to the normal mode or the dump mode. At the normal mode, the memory controller 120 loads 1-page data for a second program operation onto the nonvolatile memory 110 during a first program operation of the nonvolatile memory 110. At the dump mode, the memory controller 120 transmits i-page data (i being an integer of 2 or more) for the second program operation to the nonvolatile memory 110 during the first program operation of the nonvolatile memory 110. The normal and dump modes will be more fully described with reference to accompanying drawings.

In example embodiments, the memory controller 120 may further issue control signals (not shown) to the nonvolatile memory 110. For example, the memory controller 120 may provide the nonvolatile memory 110 with an address latch enable (ALE) signal, a command latch enable (CLE) signal, a read enable (RE) signal, a write enable (WE) signal, a chip enable (CE) signal, a data strobe (DQS) signal, a write protect (WP) signal, and so on.

The ALE signal may be a signal informing that the address ADDR is transferred to the nonvolatile memory 110. The CLE signal may be a signal indicating that the command CMD is transferred to the nonvolatile memory 110. The memory controller 120 issues the RE signal to the nonvolatile memory 110 to control a read operation of the nonvolatile memory 110. The memory controller 120 issues the WE signal to the nonvolatile memory 110 to control a program operation of the nonvolatile memory 110. The memory controller 120 issues the CE signal to the nonvolatile memory 110 to select one of memory chips of the nonvolatile memory 110. The memory controller 120 controls data communications with the nonvolatile memory 110 by sending the DQS signal to the nonvolatile memory 110. The memory controller 120 sends the WP signal to the nonvolatile memory 110 to limit (and/or prevent) an unwanted write operation about the nonvolatile memory 110.

In example embodiments, the memory controller 120 may provide a variety of voltages to the nonvolatile memory 110. The memory controller may provide the nonvolatile memory 110 with a power supply voltage VCC, a ground voltage VSS, a power supply voltage for input/output VCCQ, a ground voltage for input/output VSSQ, and so on.

Below, an example is discussed where the nonvolatile memory 110 includes a NAND flash memory. However, example embodiments are not limited thereto. For example, example embodiments may be applied to nonvolatile memories, including, but not limited to, EPROM (Electrically Programmable Read Only Memory), EEPROM (Electrically Erasable and Programmable ROM), PRAM (Phase Change Random Access Memory), MRAM (Magnetic RAM), RRAM (Resistive RAM), FRAM (Ferroelectric RAM), and so on. Also, example embodiments are applicable to volatile memories, such as, but not limited to, DRAM (Dynamic RAM), SRAM (Static RAM), SDRAM (Synchronous DRAM), and so on.

Figure 2:
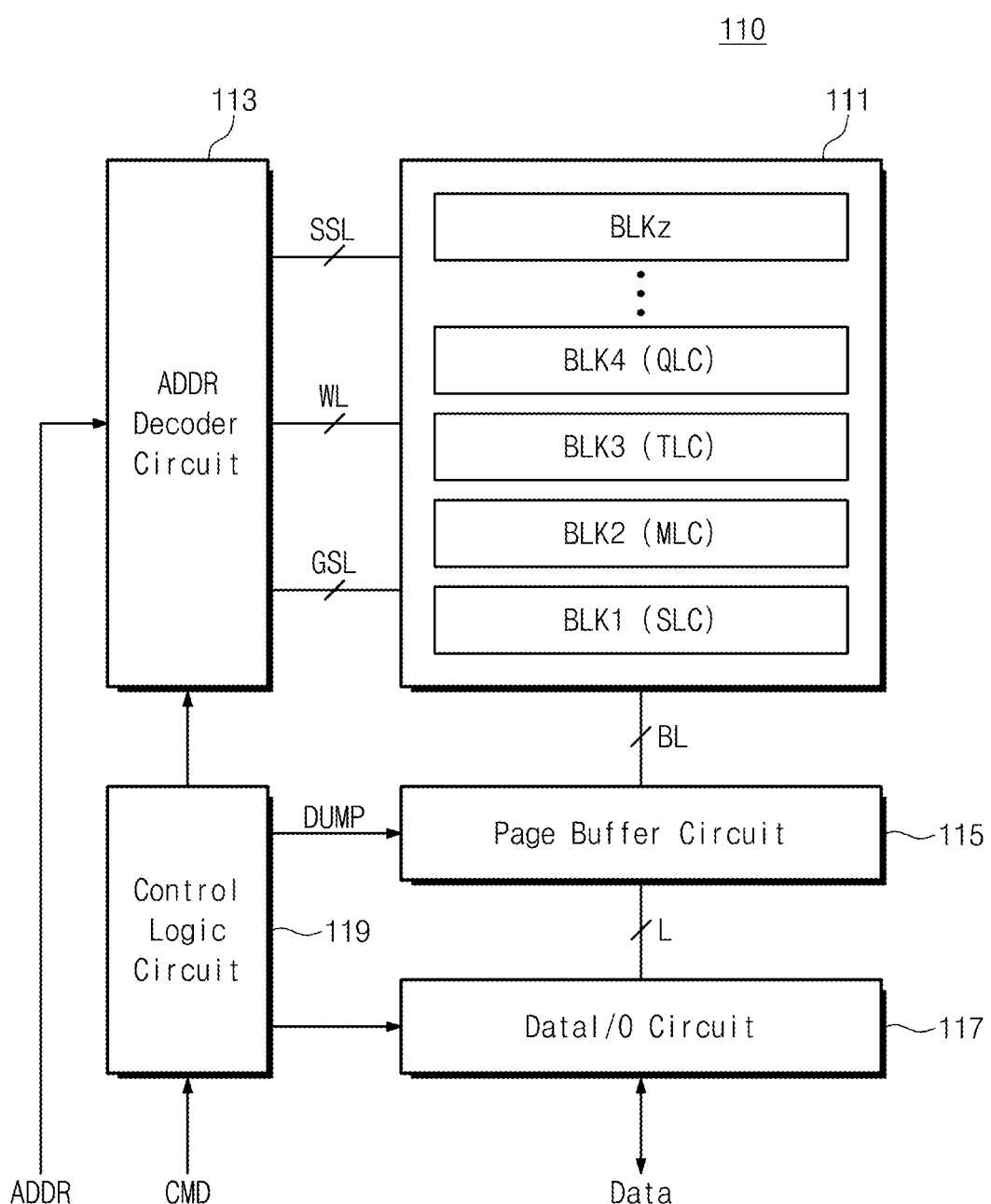
FIG. 2 is a block diagram schematically illustrating a nonvolatile memory shown in FIG. 1, according to example embodiments.

FIG. 2 is a block diagram schematically illustrating a nonvolatile memory 110 shown in FIG. 1, according to example embodiments. Referring to FIG. 2, the nonvolatile memory 110 includes a memory cell array 111, an address decoder circuit 113, a page buffer circuit 115, a data input/output circuit 117, and a control logic circuit 119.

The memory cell array 111 includes a plurality of memory blocks BLK1 to BLKz, each of which a plurality of memory cells. Each memory block is connected to the address decoder circuit 113 through at least one string selection line SSL, a plurality of word lines WL, and at least one ground selection line GSL. The memory cell array 111 is connected to the page buffer circuit 115 through a plurality of bit lines BL. The memory blocks BLK1 to BLKz may be connected in common to the plurality of bit lines BL. Memory cells of the memory blocks BLK1 to BLKz may have the same structure.

Levels may be assigned to the memory blocks BLK1 to BLKz, respectively. A level set to each memory block may indicate the number of bits that are stored in a memory cell. For example, a first memory block BLK1 may have a single level. That is, each memory cell of the first memory block BLK1 stores a bit. This may mean that memory cells of the first memory block BLK1 act as a single level cell (SLC).

A second memory block BLK2 may have a multi-level. That is, each memory cell of the second memory block BLK2 stores two bits. This may mean that memory cells of the first memory block BLK1 act as a multi-level cell (MLC).

A third memory block BLK3 may have a triple level, and a fourth memory block BLK4 may have a quad level. That is, each memory cell of the third memory block BLK2 stores three bits, and each memory cell of the fourth memory block BLK4 stores four bits. Thus, memory cells of the third memory block BLK3 act as a triple-level cell (TLC), and memory cells of the fourth memory block BLK4 act as a quad-level cell (QLC).

In example embodiments, levels of the memory blocks BLK1 to BLKz may be set within the nonvolatile memory 110. For example, levels of the memory blocks BLK1 may be decided using a variety of manners: fuses (e.g., laser fuses, electrical fuses, and so on), metal options, and firmware.

In example embodiments, levels of the memory blocks BLK1 to BLKz may be set outside of the nonvolatile memory 110. For example, a memory controller 120 (refer to FIG. 1) may set a level of the first memory block BLK1 such that 1-bit data is stored in each memory cell of the first memory block BLK1. In this case, the memory controller 120 controls the nonvolatile memory 110 such that 1-bit data is only programmed at each memory cell of the first memory block BLK1. The memory controller 120 may set a level of the second memory block BLK2 such that 2-bit data is stored in each memory cell of the second memory block BLK2. In this case, the memory controller 120 controls the nonvolatile memory 110 such that 2-bit data is only programmed at each memory cell of the second memory block BLK2. Likewise, the memory controller 120 controls the nonvolatile memory 110 such that 3-bit data is only programmed at each memory cell of the third memory block BLK3 and such that 4-bit data is only programmed at each memory cell of the fourth memory block BLK4.

Below, "a maximum level" may be defined. The maximum level may mean the highest level of levels of memory cells of the memory cell array 111. For example, in the event that the memory cell array 111 does not include memory cells over a 4-level, the quad-level assigned to the fourth memory block BLK4 may be the maximum level.

The address decoder circuit 113 is connected to the memory cell array 111 through a plurality of ground selection lines GSL, the plurality of word lines WL, and a plurality of string selection lines SSL. The address decoder circuit 113 operates according to a control of the control logic circuit 119. The address decoder circuit 113 receives an address ADDR from a memory controller 120 (refer to FIG. 3). The address decoder circuit 113 decodes the address ADDR and controls voltages to be applied to the word lines WL according to the decoded address. For example, during a program operation, the address decoder circuit 113 applies a pass voltage to the word lines WL according to a control of the control logic circuit 119. During the program operation, the address decoder circuit 113 further applies a program voltage to one, corresponding to the address ADDR, from among the word lines WL according to a control of the control logic circuit 119.

The page buffer circuit 115 is connected to the memory cell array 111 through the bit lines BL. The page buffer circuit 115 is connected to the data input/output circuit 117 through a plurality of data lines DL. The page buffer circuit 115 operates according to a control of the control logic circuit 119. The page buffer circuit 115 receives a dump signal DUMP from the control logic circuit 119.

The page buffer circuit 115 stores data to be programmed in memory cells of the memory cell array 111 or data read from memory cells thereof. During a program operation, the page buffer circuit 115 stores data to be programmed in the memory cells. Based on the stored data, the page buffer circuit 115 biases the plurality of bit lines BL. The page buffer circuit 115 functions as a write driver at the program operation. During a read operation, the page buffer circuit 115 senses voltages on the bit lines BL and stores sensing results. The page buffer circuit 115 functions as a sense amplifier at the read operation.

The data input/output circuit 117 is connected to the page buffer circuit 115 through the data lines DL. The data input/output circuit 117 exchanges data with the memory controller 120.

The data input/output circuit 117 temporarily stores data received from the memory controller 120. The data input/output circuit 117 transfers the stored data to the page buffer circuit 115. The data input/output circuit 117 temporarily stores data transferred from the page buffer circuit 115. The data input/output circuit 117 transfers the stored data to the memory controller 120. The data input/output circuit 117 functions as a buffer memory.

The control logic circuit 119 receives the command CMD from the memory controller 120. The control logic circuit 119 decodes the command CMD and controls an overall operation of the nonvolatile memory 110 according to the decoded command. The control logic circuit 119 further receives a variety of control signals and voltages from the memory controller 120.

Figure 3:
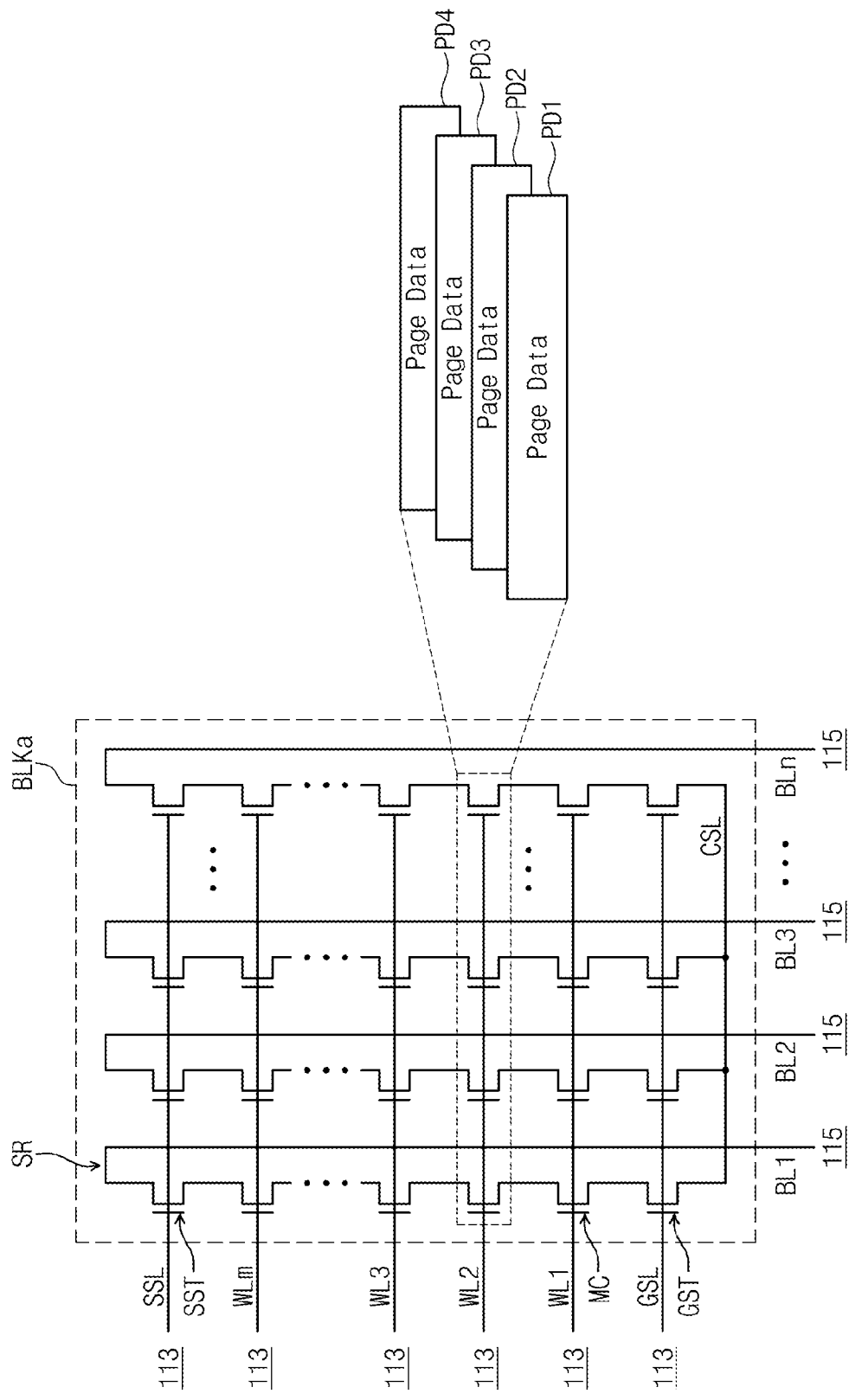
FIG. 3 is a circuit diagram schematically illustrating a memory block according to example embodiments.

FIG. 3 is a circuit diagram schematically illustrating a memory block BLKa according to example embodiments. In FIG. 3, one memory block BLKa of a plurality of memory blocks BLK1 to BLKz in the memory cell array 111 shown in FIG. 2 is illustrated.

Referring to FIGS. 2 and 3, a memory block BLKa includes a plurality of strings SR that are connected to a plurality of bit lines BL1 to BLn, respectively. Each string SR includes a ground selection transistor GST, memory cells MC, and a string selection transistor SST. Although FIG. 3 illustrates each string SR includes one ground selection transistor GST and one string selection transistor SST, example embodiments are not limited thereto. For example, each string SR may include a plurality of string selection transistors SST (e.g., two SSTs) on the memory cells MC and/or a plurality of ground selection transistors (e.g., two GSTs) between the memory cells MC and the bit lines BL1 to BLn.

In each string SR, the ground selection transistor GST is connected between the memory cells MC and a common source line CSL. The ground selection transistors GST of the strings SR are connected in common to the common source line CSL.

In each string SR, the ground selection transistor GST is connected between the memory cells MC and a bit line BL. The ground selection transistors GSTs of the strings SR are connected to a plurality of bit lines BL1 to BLn, respectively. The bit lines BL1 to BLn may be connected to a page buffer circuit 115. In each string SR, the string selection transistor SST is connected to a string selection line SSL.

In each string SR, the plurality of memory cells MC are connected between the ground selection transistor GST and the string selection transistor SST. In each string SR, the plurality of memory cells MC are connected in series.

In the strings SR, memory cells MC having the same height from the common source line CSL are connected in common to a word line. The memory cells MC of the strings SR are connected to a plurality of word lines WL1 to WLm. The word lines WL1 to WLm may be connected to the address decoder circuit 113.

Memory cells MC connected to a word line WL may store one or more pages of data PD. Pages of data programmed at memory cells MC connected to a word line WL may correspond to bits programmed at a memory cell, respectively.

A first bit programmed at a memory cell MC belongs to first page data PD1. The first page data PD1 may be programmed as first bits at memory cells connected to a word line (e.g., WL2). A second bit programmed at a memory cell MC belongs to second page data PD2. The second page data PD2 may be programmed as second bits at memory cells connected to the word line WL2. A third bit programmed at a memory cell MC belongs to third page data PD3. The third page data PD3 may be programmed as third bits at memory cells connected to the word line WL2. A fourth bit programmed at a memory cell MC belongs to fourth page data PD4. The fourth page data PD4 may be programmed as fourth bits at memory cells connected to the word line WL2.

For example, when a quad-level is assigned to the memory bock BLKa, four pages of data may be programmed at memory cells, connected to a word line, from among memory cells MC of the memory block BLKa. When a triple-level is assigned to the memory bock BLKa, three pages of data may be programmed at memory cells, connected to a word line, from among memory cells MC of the memory block BLKa. When an "I"-level is assigned to the memory bock BLKa, "I" pages of data may be programmed at memory cells, connected to a word line, from among memory cells MC of the memory block BLKa.

Figure 4:
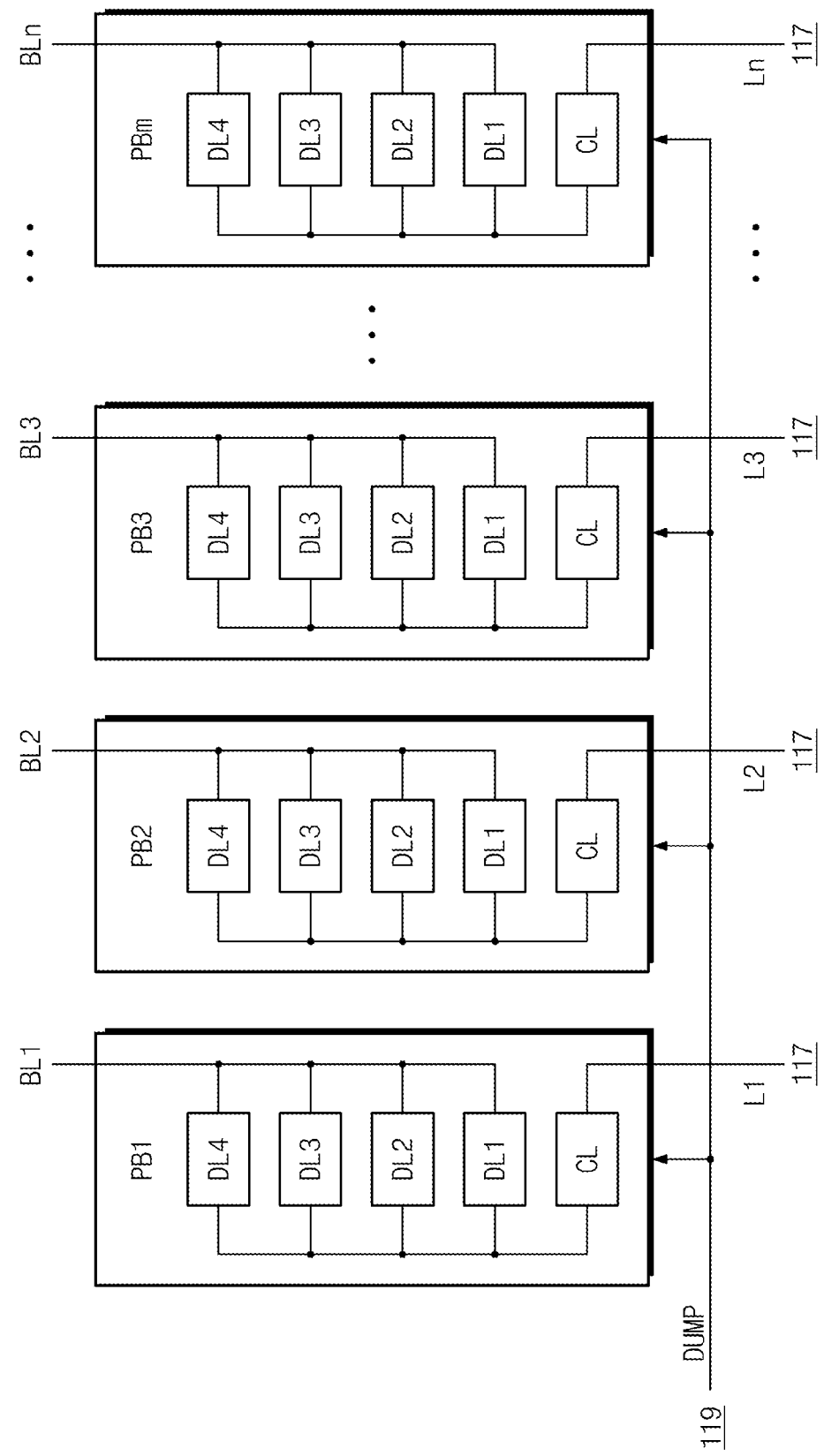
FIG. 4 is a block diagram schematically illustrating a page buffer circuit according to example embodiments.

FIG. 4 is a block diagram schematically illustrating a page buffer circuit 115 according to example embodiments. In FIG. 4, the page buffer circuit 115 of the nonvolatile memory 10 shown in FIG. 2 is illustrated.

Referring to FIGS. 2 to 4, the page buffer circuit 115 includes a plurality of page buffers PB1 to PBn, which are connected to a plurality of bit lines BL1 to BLn, respectively. The plurality of bit lines BL1 to BLn may be connected to a memory cell array 111. The page buffers PB1 to PBn are connected to a plurality of data lines L1 to Ln, respectively. The data lines L1 to Ln may be connected to a data input/output circuit 117.

The page buffers PB1 to PBn receive a dump signal DUMP from a control logic circuit 119.

Each of the page buffers PB1 to PBn includes a plurality of data latches DL1 to DL4 and a cache latch CL. In each page buffer, each of the data latches DL1 to DL4 may store a bit, and the cache latch CL may store a bit. The cache latches CL of the page buffers PB1 to PBn may store 1-page data. The first data latches DL1 of the page buffers PB1 to PBn may store 1-page data, and the second data latches DL2 of the page buffers PB1 to PBn may store 1-page data. The third data latches DL3 of the page buffers PB1 to PBn may store 1-page data, and the fourth data latches DL4 of the page buffers PB1 to PBn may store 1-page data.

The page buffers PB1 to PBn may have the same structure and operate in the same manner. For ease of description, a structure and a function of the first page buffer PB1 will be described.

The data latches DL1 to DL4 of the first page buffer PB1 are connected to a bit line BL. For example, the number of data latches in a page buffer may correspond to a maximum level that a nonvolatile memory 110 supports. For example, the page buffer PB1 includes data latches the number of which corresponds to the number of bits to be programmed maximally at a memory cell. The page buffer PB1 may be equipped a number of data latches that corresponds to a value of a maximum level capable of being assigned to memory blocks BLK1 to BLKz of the nonvolatile memory 110. The page buffer PB1 may include a number of data latches that corresponds to the number of page data capable of being programmed maximally at a page.

At programming, data to be programmed at a memory cell connected to a bit line BL1 may be stored in the data latches DL1 to DL4. The data to be programmed may be stored in some or all of the data latches DL1 to DL4. Data to be programmed at a 4-level memory cell may be formed of four bits. When a 4-level cell is programmed, the data to be programmed may be stored at the data latches DL1 to DL4. Data to be programmed at a 3-level memory cell may be formed of three bits. When a 3-level cell is programmed, the data to be programmed may be stored at three data latches of the data latches DL1 to DL4. Likewise, when an "I"-level cell is programmed, data to be programmed may be stored at "i" data latches among the data latches DL1 to DL4. Although the page buffer PB1 in FIG. 4 is illustrated as including four data latches DL1 to DL4, example embodiments are not limited thereto. For example, the page buffer PB1 may include more than four data latches (DL1 to DL4). For example, in example embodiments, although not illustrated, when a 5-level cell is programmed, the data to be programmed may be stored at five data latches. A During a program operation, the page buffer PB1 applies a voltage to the bit line BL1 based on data stored in the data latches DL1 to DL4.

The cache latch CL is connected to a data line DL1. The cache latch CL stores data received via the data line DL1. In response to the dump signal DUMP, the cache latch CL dumps data onto one of the data latches DL1 to DL4.

Figure 5:
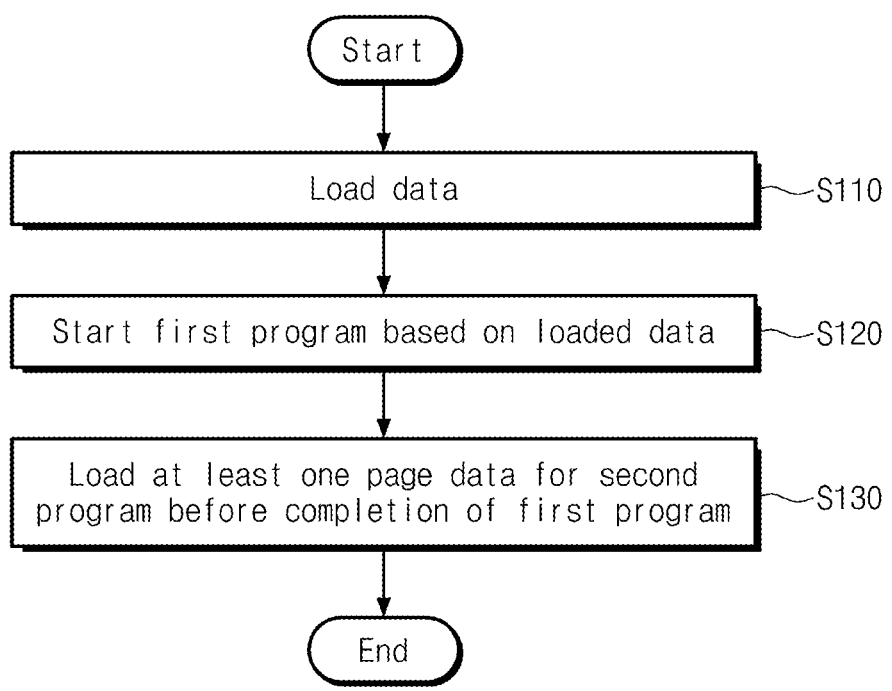
FIG. 5 is a flow chart schematically illustrating a program method according to example embodiments.

FIG. 5 is a flow chart schematically illustrating a program method according to example embodiments. Referring to FIGS. 1 and 5, in step S110, data is loaded. For example, a memory controller 120 loads onto a nonvolatile memory 110 data to be programmed at the nonvolatile memory 110.

In step S120, a first program operation is executed based on the loaded data. The memory controller 120 controls the nonvolatile memory 110 such that the loaded data is programmed. According to a control of the memory controller 120, the nonvolatile memory 110 performs the first program operation during which the loaded data is programmed.

In step S130, the memory controller 120 loads onto the nonvolatile memory 110 at least one page of data to be used in a second program operation, before the first program is ended.

Figure 6:
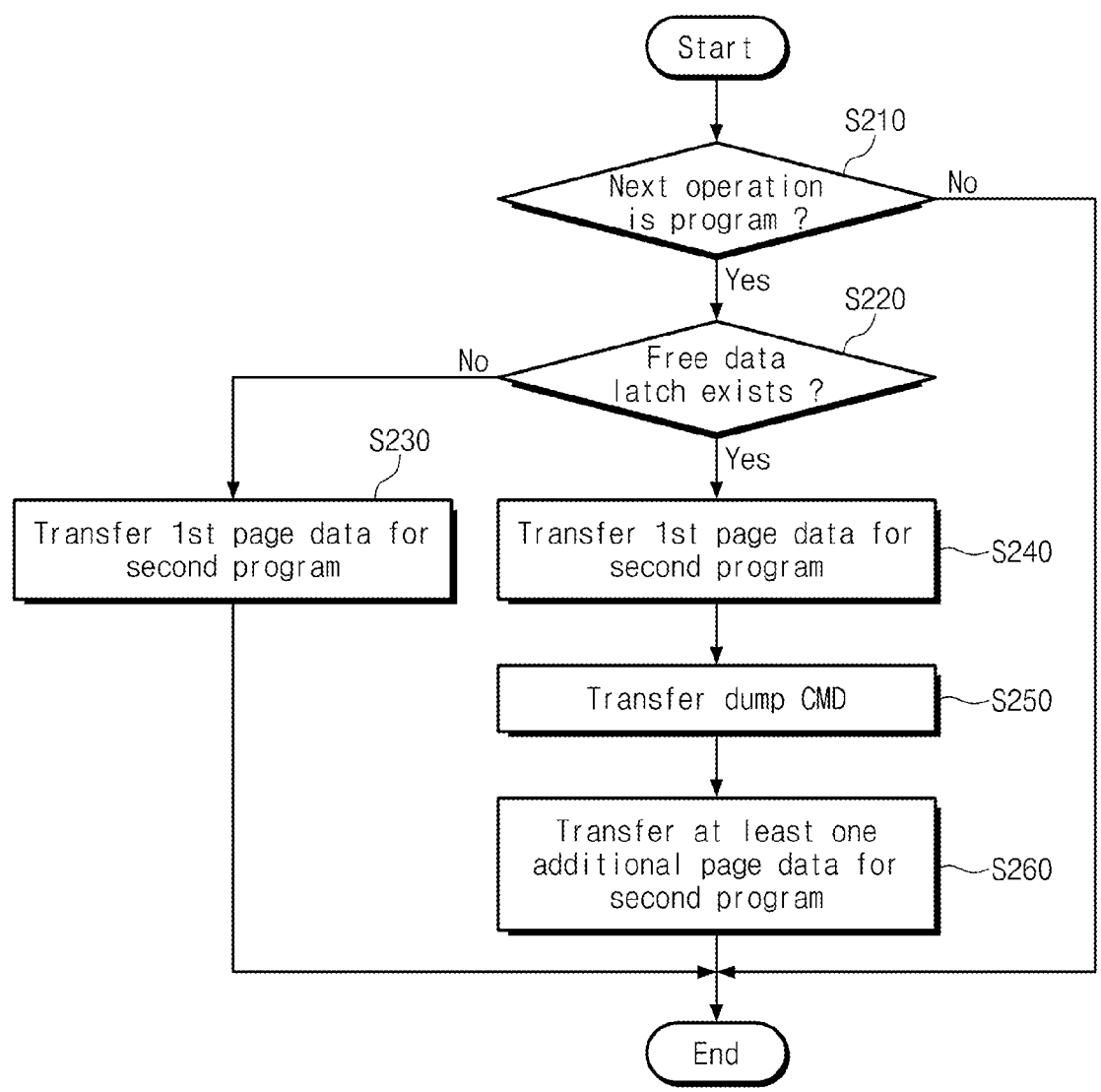
FIG. 6 is a flow chart schematically illustrating an operating method of a memory controller according to example embodiments.

FIG. 6 is a flow chart schematically illustrating an operating method of a memory controller 120 according to example embodiments. In FIG. 6, an illustration of an operation (S130) of transmitting at least one page of data to a nonvolatile memory 110 before completing a first program operation of the nonvolatile memory 110 is shown.

Referring to FIGS. 1 and 6, in step S210, whether or not a next operation is a program operation is determined. For example, the memory controller 120 may determine if the next operation is a program operation. If a next operation is not a program operation, loading of page data is not executed. If a next operation is a program operation, in step S220, the memory controller 120 may determine whether or not a free data latch exists. For example, whether or not a free data latch, not used in the first program operation, from among data latches DL1 to DL4 (refer to FIG. 4) connected to each bit line BL exists may be determined. For example, it is assumed that the number of data latches connected to each bit line is "i" (i being an integer) and a memory controller 120 loads "j" pages of data ("j" less than or equal to "i") for a first program operation onto the data latches DL1 to DL4. With this assumption, in each bit line, (i-j) data latches may be free data latches that are not used in the first program operation. The memory controller 120 may determine whether or not a free data latch exists, based on the number of pages of data transmitted to the nonvolatile memory 110 for the first program operation and the number of data latches connected to each bit line of the nonvolatile memory 110.

If a free data latch does not exist, the program operation control unit 130 classifies a current mode as a normal mode. The program operation control unit 130 controls programming associated with a second program operation following the first program operation according to the normal mode.

In case of the normal mode, in step S230, first page data for the second program operation following the first program operation is transmitted. The memory controller 120 transfers the first page data to the nonvolatile memory 110. The first page data transmitted from the memory controller 120 is stored in cache latches CL of the nonvolatile memory 110.

If a free data latch exists, the program operation control unit 130 classifies a current mode as a dump mode. The program operation control unit 130 controls programming associated with the second program operation following the first program operation according to the dump mode.

In case of the dump mode, in step S240, first page data for the second program operation following the first program operation is transmitted. The memory controller 120 transfers the first page data to the nonvolatile memory 110. The first page data transmitted from the memory controller 120 is stored in the cache latches CL of the nonvolatile memory 110.

In step S250, the memory controller 120 provides the nonvolatile memory 110 with a dump command. The dump command may be a command that is used to activate a dump signal DUMP of the nonvolatile memory 110. The dump command may be a command that controls the nonvolatile memory 110 such that data stored in the cache latch CL corresponding to each bit line BL is loaded onto one of data latches DL1 to DL4 connected to each bit line. In step S260, the memory controller 120 provides the nonvolatile memory 110 with at least one additional page of data for the second program operation.

Step S230 or steps S240 to S260 may be executed before completion of the first program operation. When a free data latch exists, that is, during the dump mode, at least two or more pages of data for the second program operation may be loaded onto the nonvolatile memory 110 before the first program operation of the nonvolatile memory 110 is completed. The memory controller issues a dump command associated with the second program operation to the nonvolatile memory 110 prior to an end of the first program operation.

Figure 7:
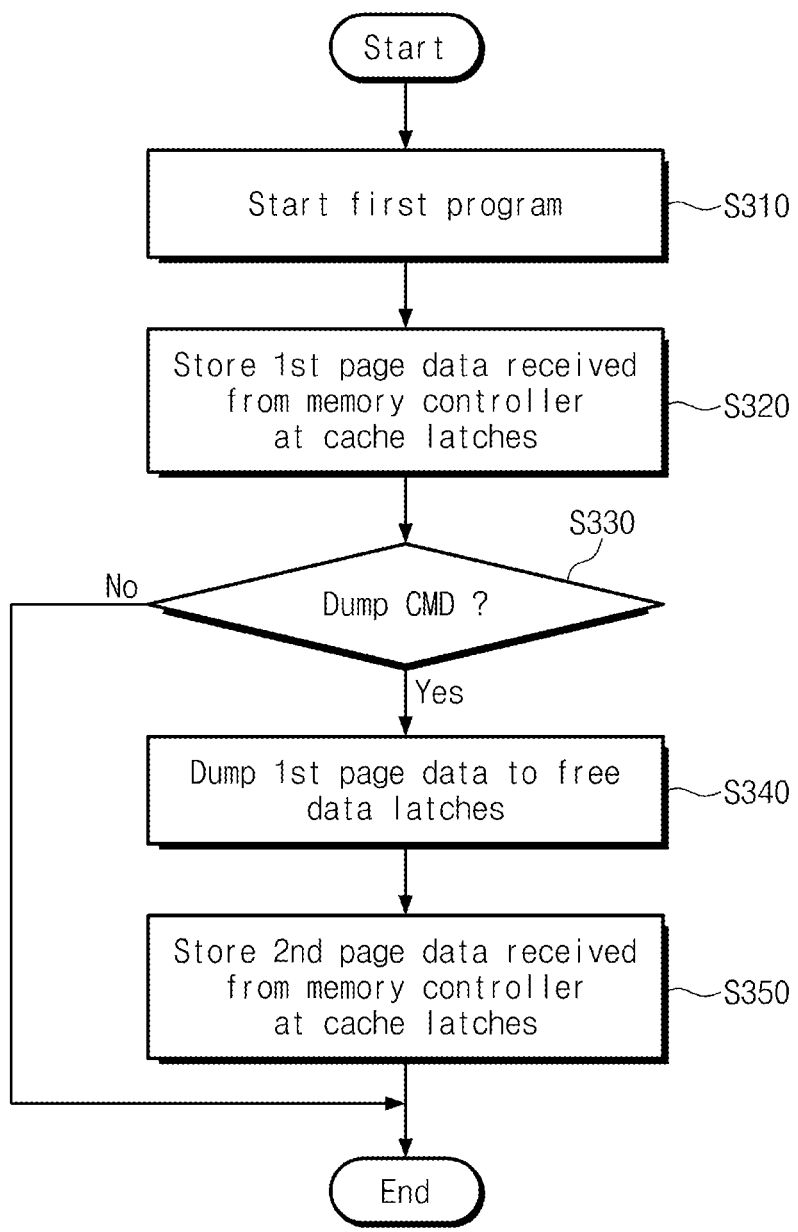
FIG. 7 is a flow chart schematically illustrating an operating method of a nonvolatile memory according to example embodiments.

FIG. 7 is a flow chart schematically illustrating an operating method of a nonvolatile memory 110 according to example embodiments. In FIG. 7, an illustration is shown of an operation (S130) of loading at least one page of data onto a nonvolatile memory 110 before a first program operation of the nonvolatile memory 110 is ended. Referring to FIGS. 1 and 7, in step S310, a first program operation commences. The nonvolatile memory 110 starts the first program operation based on at least one page of data received from a memory controller 120.

In step S320, the nonvolatile memory 110 stores first page data received from the memory controller 120 in cache latches CL (refer to FIG. 4). For example, the memory controller 120 transmits the first page data for a second program operation to the nonvolatile memory 110. That is, the first page data for the second program operation is stored in the cache latches CL of the nonvolatile memory 110.

In step S330, whether or not a dump command is received is determined. For example, the memory controller 120 may determine whether or not a dump command is received. If the dump command is not received, the nonvolatile memory 110 does not load additional page data.

If the dump command is received, in step S340, the nonvolatile memory 110 transfers the first page data stored in the cache latches CL to free data latches. For example, the memory controller 120 issues the dump command to the nonvolatile memory 110 when a part of data latches DL1 to DL4 connected to each bit line is free. In response to the dump command, the nonvolatile memory 110 dumps the first page data stored in the cache latches CL on free data latches. The cache latches CL may be released under a control of a control logic circuit 119 after the first page data is dumped.

In step S350, the nonvolatile memory 110 stores second page data received from the memory controller 120 in the cache latches CL.

Figure 8:
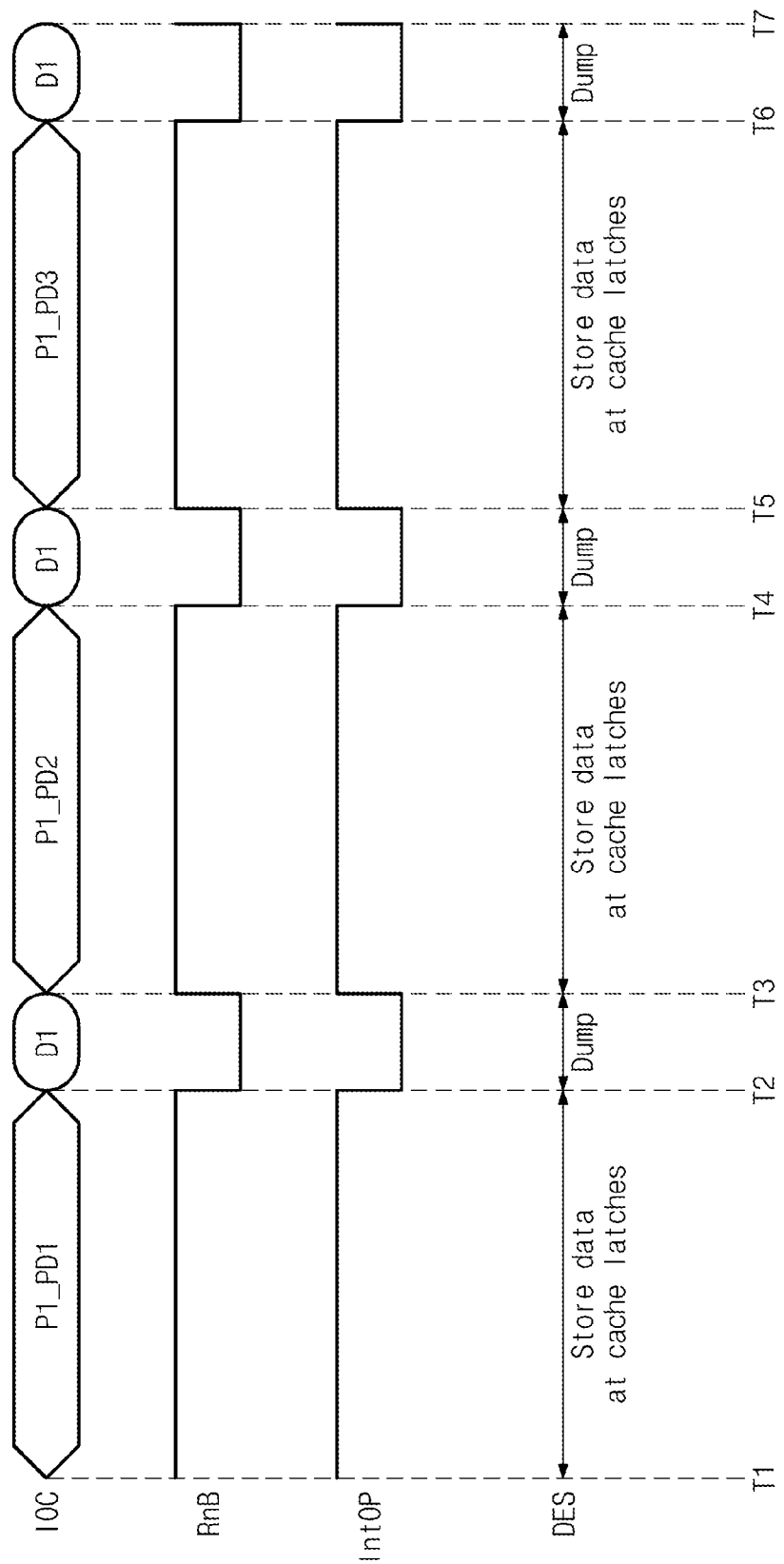
FIG. 8 is a timing diagram schematically illustrating an example of programming executed according to a method described with reference to FIGS. 5 to 7.

FIG. 8 is a timing diagram schematically illustrating an example of programming executed according to a method described with reference to FIGS. 5 to 7. In FIG. 8, an input/output channel IOC shows signals or information that is exchanged between a nonvolatile memory and a memory controller 120. A ready/busy signal RnB indicates a state of a nonvolatile memory 110 and is output to the memory controller 120 from the nonvolatile memory 110. An internal operation IntOP shows whether or not the nonvolatile memory 110 internally operates. A relation description DES shows an additional explanation associated with an operation of a memory system 100 (refer to FIG. 1).

Figure 9:
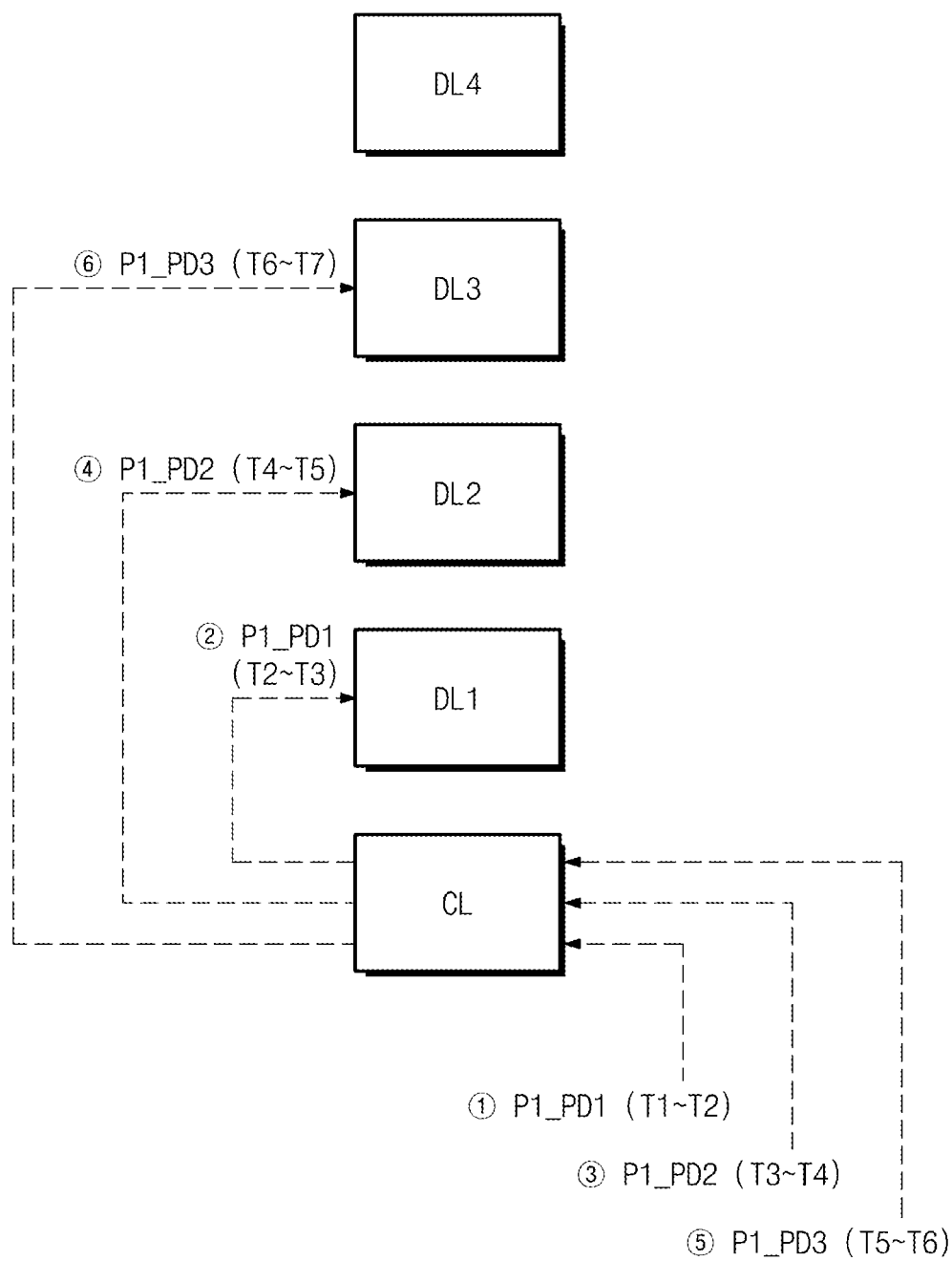
FIG. 9 is a block diagram schematically illustrating a data flow of data latches DL1 to DL4, connected to a bit line, and a cache latch CL, when an example shown in FIG. 8 is performed.

FIG. 9 is a block diagram schematically illustrating a data flow of data latches DL1 to DL4, connected to a bit line, and a cache latch CL, when an example shown in FIG. 8 is performed.

Referring to FIGS. 1, 8, and 9, at T1, the loading about data for use in a first program operation of a nonvolatile memory 110 commences.

Between T1 and T2, a memory controller 120 transmits first page data P1_PD1 associated with the first program operation to the nonvolatile memory 110. The first page data P1_PD1 may be loaded onto cache latches CL of the nonvolatile memory 110 (①). The memory controller 120 may further issue a command informing a start of programming associated with the first program operation and an address associated with the first program operation to the nonvolatile memory 110 through an input/output channel IOC.

During a transfer of the first page data P1_PD1, the nonvolatile memory 110 outputs a ready/busy signal RnB having a high level indicating a ready state to the memory controller 120. Since the nonvolatile memory 110 does not operate internally during a transfer of the first page data P1_PD1, an internal operation IntOP exhibits a high level indicating a ready state.

Between T2 and T3, the memory controller 120 issues a dump command D1 to the nonvolatile memory 110. In response to the dump command D1, the nonvolatile memory 110 dumps data stored in the cache latches CL onto first data latches DL1 (②). Under a control of the nonvolatile memory 110, the ready/busy signal RnB transitions from a high level to a low level, indicating a busy state, while the first page data P1_PD1 is dumped. If the first page data P1_PD1 is all dumped, the nonvolatile memory 110 sets the ready/busy signal RnB to a high level indicating a ready state. The internal operation IntOP of the nonvolatile memory 110 has a low level indicating a busy state while the first page data P1_PD1 is dumped. If the first page data P1_PD1 is all dumped, the internal operation IntOP of the nonvolatile memory 110 is set to a high level indicating a ready state.

Between T3 and T4, the memory controller 120 transmits second page data P1_PD2 associated with the first program operation to the nonvolatile memory 110. The memory controller 120 transmits the second page data P1_PD2 to the nonvolatile memory 110 in response to a low-to-high transition of the ready/busy signal RnB. The second page data P1_PD2 may be loaded onto the cache latches CL of the nonvolatile memory 110 (③).

Between T4 and T5, the memory controller 120 issues the dump command D1 to the nonvolatile memory 110. In response to the dump command D1, the nonvolatile memory 110 dumps the second page data P1_PD2 stored in the cache latches CL onto second data latches DL2 (④). Under a control of the nonvolatile memory 110, the ready/busy signal RnB transitions from a high level to a low level, indicating a busy state, while the second page data P1_PD2 is dumped. The internal operation IntOP of the nonvolatile memory 110 has a busy state (e.g., a low level) while the second page data P1_PD2 is dumped.

Between T5 and T6, the memory controller 120 transmits third page data P1_PD3 associated with the first program operation to the nonvolatile memory 110. The third page data P1_PD3 may be loaded onto the cache latches CL of the nonvolatile memory 110 (⑤).

Between T6 and T7, the memory controller 120 issues the dump command D1 to the nonvolatile memory 110. In response to the dump command D1, the nonvolatile memory 110 dumps the third page data P1_PD3 stored in the cache latches CL onto third data latches DL3 (⑥). Under a control of the nonvolatile memory 110, the ready/busy signal RnB transitions from a high level to a low level, indicating a busy state, while the third page data P1_PD3 is dumped. The internal operation IntOP of the nonvolatile memory 110 has a busy state (e.g., a low level) while the third page data P1_PD3 is dumped.

Figure 10:
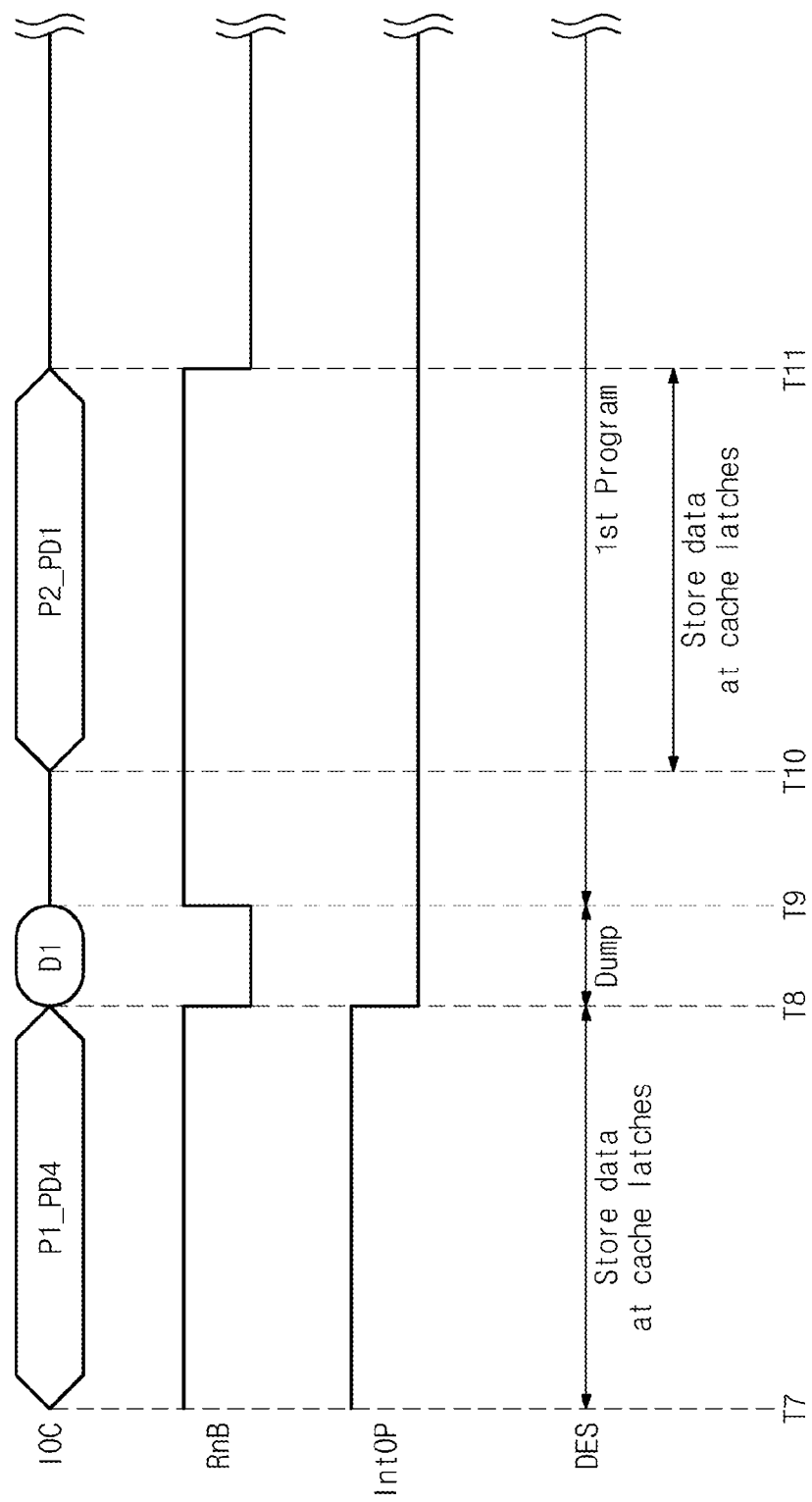
FIG. 10 is a timing diagram schematically illustrating an example of programming executed according to a method described with reference to FIGS. 5 to 7.
Figure 11:
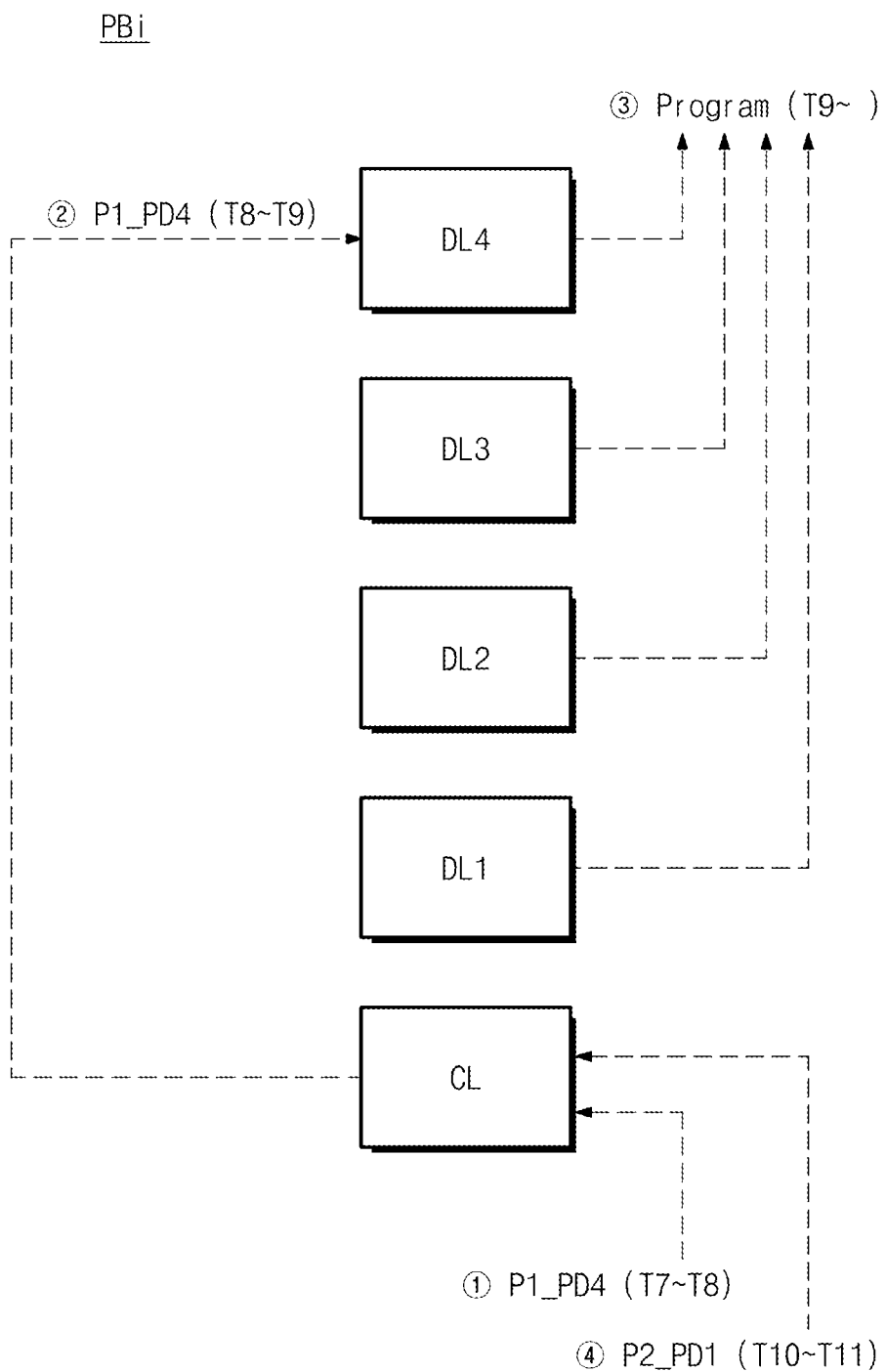
FIG. 11 is a block diagram schematically illustrating a data flow of data latches, connected to a bit line, and a cache latch, when an example shown in FIG. 10 is performed.

FIG. 10 is a timing diagram schematically illustrating an example of programming executed according to a method described with reference to FIGS. 5 to 7. FIG. 10 shows an operation following an operation described with reference to FIG. 8. FIG. 11 is a block diagram schematically illustrating a data flow of data latches DL1 to DL4, connected to a bit line, and a cache latch CL, when an example shown in FIG. 10 is performed.

Referring to FIGS. 1, 10, and 11, between T7 and T8, a memory controller 120 transmits fourth page data P1_PD4 associated with a first program operation to a nonvolatile memory 110. The fourth page data P1_PD4 may be loaded onto cache latches CL of the nonvolatile memory 110 (①).

Between T8 and T9, the memory controller 120 issues a dump command D1 to the nonvolatile memory 110. In response to the dump command D1, the nonvolatile memory 110 dumps the fourth page data P1_PD4 stored in the cache latches CL onto fourth data latches DL4 (②). Under a control of the nonvolatile memory 110, a ready/busy signal RnB is set to a busy state (e.g., a low level) while the fourth page data P1_PD4 is dumped. An internal operation IntOP of the nonvolatile memory 110 has a busy state (e.g., a low level) while the fourth page data P1_PD4 is dumped.

In example embodiments, the first program operation may be a program operation based on first to fourth page data P1_PD1 to P1_PD4. For example, the first program operation may be a program operation about memory cells of a fourth memory block BLK4 (refer to FIG. 2) having a 4-level (e.g., a maximum level). When the fourth page data P1_PD4 is loaded onto the nonvolatile memory 110, all page data for the first program operation may be loaded onto the nonvolatile memory 110. Thus, the nonvolatile memory 110 starts the first program operation based on the first to fourth page data P1_PD1 to P1_PD4 (③). For example, the memory controller 120 may issue a command directing a start of the first program operation to the nonvolatile memory 110. The nonvolatile memory 110 starts the first program operation in response to the command directing a start of the first program operation.

If the fourth page data P1_PD4 is all dumped, at T9, the nonvolatile memory 110 sets the ready/busy signal RnB to a ready state (e.g., a high level). If the first program operation commences, at T9, an internal operation IntOP of the nonvolatile memory 110 retains a busy state (e.g., a low level). The internal operation IntOP of the nonvolatile memory 110 retains the busy state (e.g., a low level) until the first program operation is ended.

The number of data latches DL1 to DL4 connected to a bit line BL is 4. The first program operation is performed based on four page data P1_PD1 to P1_PD4. Thus, a program operation control unit 130 classifies the first program operation as a normal mode.

T10 and T11 may be any time after the first program operation is carried out and before the first program operation is ended.

Between T10 and T11, the memory controller 120 transmits first page data P2_PD1 associated with a second program operation to the nonvolatile memory 110. The first page data P2_PD1 may be loaded onto the cache latches CL of the nonvolatile memory 110 (④). If the first page data P2_PD1 is all loaded onto the cache latches CL, the ready/busy signal RnB is set to a busy state (e.g., a low level) under a control of the nonvolatile memory 110.

Figure 12:
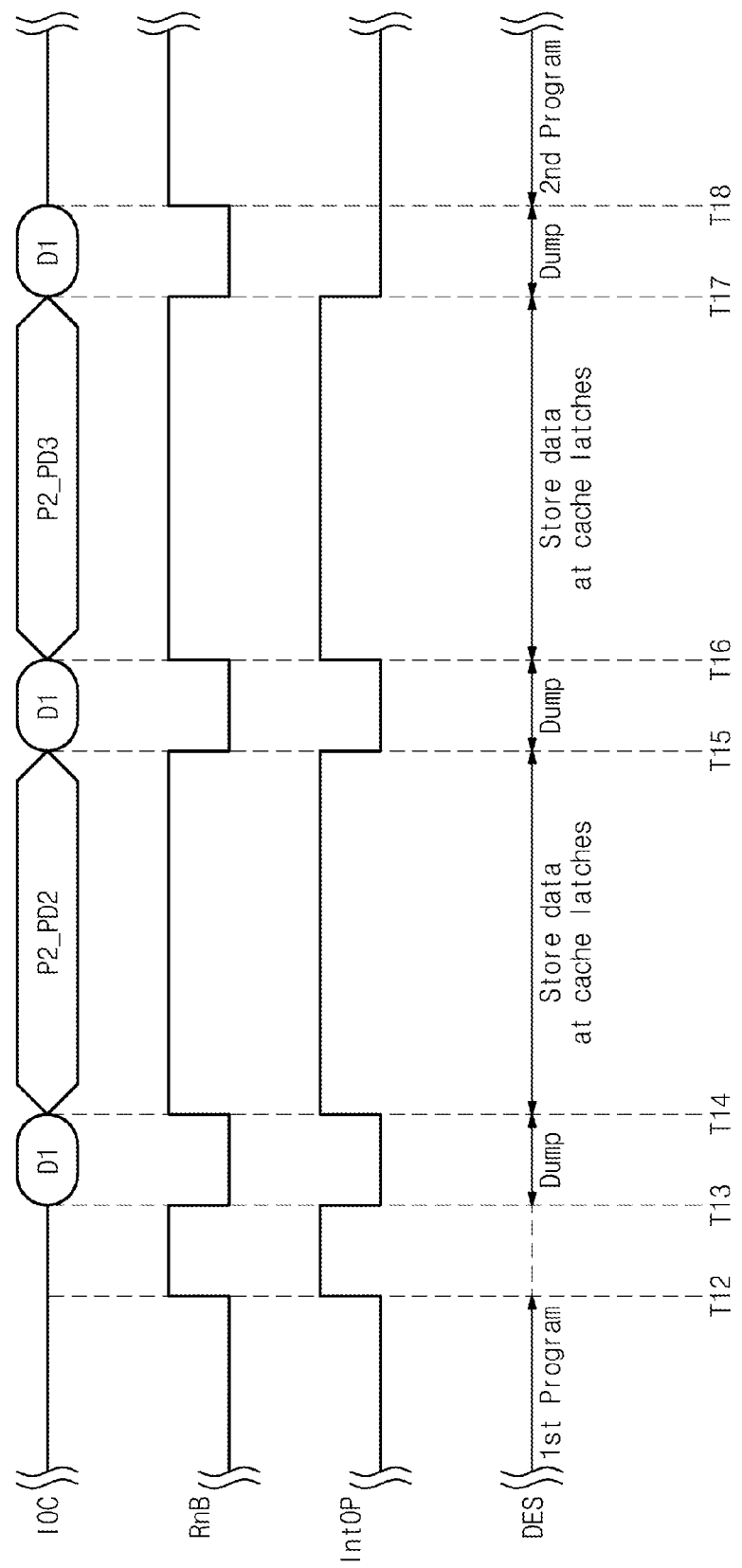
FIG. 12 is a timing diagram schematically illustrating still an example of programming executed according to a method described with reference to FIGS. 5 to 7.
Figure 13:
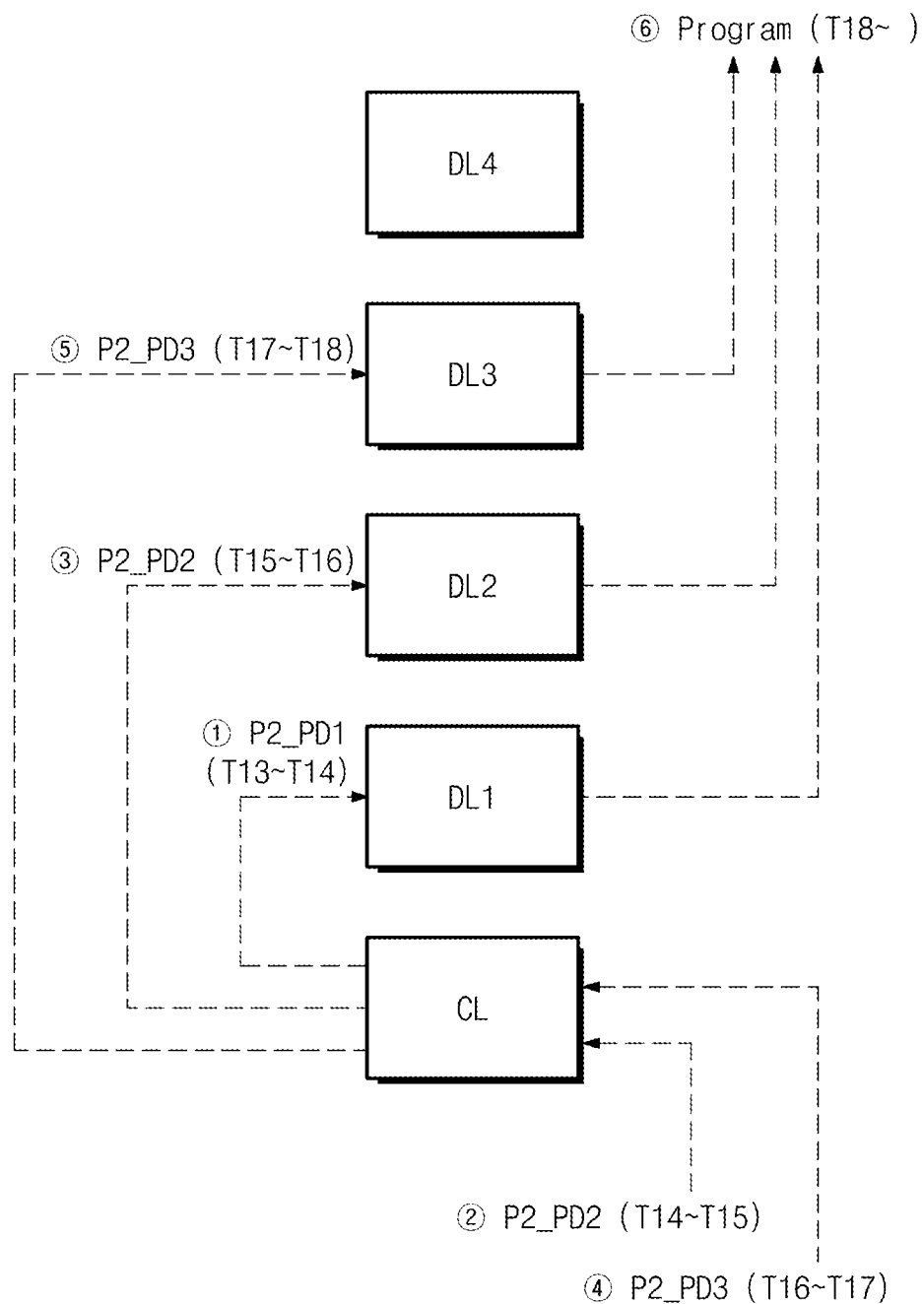
FIG. 13 is a block diagram schematically illustrating a data flow of data latches, connected to a bit line, and a cache latch, when an example shown in FIG. 12 is performed.

FIG. 12 is a timing diagram schematically illustrating an example of programming executed according to a method described with reference to FIGS. 5 to 7. FIG. 12 shows an operation following an operation described with reference to FIG. 10. FIG. 13 is a block diagram schematically illustrating a data flow of data latches DL1 to DL4, connected to a bit line, and a cache latch CL, when an example shown in FIG. 12 is performed.

Referring to FIGS. 1, 12, and 13, at T12, a first program operation is ended. At this time, a ready/busy signal RnB is set to a ready state (e.g., a high level), and an internal operation IntOP of a nonvolatile memory 110 has a ready state (e.g., a high level).

Between T13 and T14, a memory controller 120 issues a dump command D1 to a nonvolatile memory 110 in response to the ready/busy signal RnB having a ready state. In response to the dump command D1, the nonvolatile memory 110 dumps the first page data P2_PD1 stored in the cache latches CL onto first data latches DL1 (①). Under a control of the nonvolatile memory 110, the ready/busy signal RnB is set to a busy state (e.g., a low level) while the first page data P2_PD1 is dumped. The internal operation IntOP of the nonvolatile memory 110 has a low level indicating a busy state while the first page data P2_PD1 is dumped.

In case of a normal mode, during the first program operation, the memory controller 120 provides the nonvolatile memory 110 with a page of data associated with the second program operation following a first program operation. The transferred page data is loaded onto the cache latches CL of the nonvolatile memory 110. The memory controller 120 waits until the first program operation of the nonvolatile memory 110 is ended. As the ready/busy signal RnB is set to a ready state (e.g., a high level) when the first program operation is ended, the memory controller 120 sends the dump command D1 to the nonvolatile memory 110. With the above description, during the first program operation, a page of data associated with the second program operation is loaded in advance onto the nonvolatile memory 110, thereby reducing an execution time of programming associated with the second program operation.

Between T14 and T15, the memory controller 120 transmits second page data P2_PD2 associated with the second program operation to the nonvolatile memory 110. The second page data P2_PD2 may be loaded onto cache latches CL of the nonvolatile memory 110 (②).

Between T15 and T16, the memory controller 120 issues the dump command D1 to the nonvolatile memory 110. In response to the dump command D1, the nonvolatile memory 110 dumps the second page data P2_PD2 stored in the cache latches CL onto second data latches DL2 (③). Under a control of the nonvolatile memory 110, the ready/busy signal RnB transitions from a high level to a low level, indicating a busy state, while the second page data P2_PD2 is dumped. The internal operation IntOP of the nonvolatile memory 110 has a low level indicating a busy state while the second page data P2_PD2 is dumped.

Between T16 and T17, the memory controller 120 transmits third page data P2_PD3 associated with the second program operation to the nonvolatile memory 110. The third page data P2_PD3 may be loaded onto the cache latches CL of the nonvolatile memory 110 (④).

Between T17 and T18, the memory controller 120 issues the dump command D1 to the nonvolatile memory 110. In response to the dump command D1, the nonvolatile memory 110 dumps the third page data P2_PD3 stored in the cache latches CL onto third data latches DL3 (⑤). Under a control of the nonvolatile memory 110, the ready/busy signal RnB is set to a busy state (e.g., a low level) while the third page data P2_PD3 is dumped. The internal operation IntOP of the nonvolatile memory 110 has a busy state (e.g., a low level) while the third page data P2_PD3 is dumped.

In example embodiments, the second program operation may be a program operation based on first to third page data P2_PD1 to P2_PD3. For example, the second program operation may be a program operation about memory cells of a third memory block BLK3 (refer to FIG. 2) having a 3-level. When the third page data P2_PD3 is loaded onto the nonvolatile memory 110, all page data for the second program operation may be loaded onto the nonvolatile memory 110. Thus, at T18, the nonvolatile memory 110 starts the second program operation based on the first to third page data P2_PD1 to P2_PD3 (⑥).

If the third page data P2_PD3 is all dumped, at T18, the nonvolatile memory 110 sets the ready/busy signal RnB to a ready state (e.g., a high level). If the second program operation commences, at T18, the internal operation IntOP of the nonvolatile memory 110 retains a busy state (e.g., a low level). The internal operation IntOP of the nonvolatile memory 110 retains the busy state (e.g., a low level) until the second program operation is ended.

The number of data latches DL1 to DL4 connected to a bit line BL is 4. The second program operation is performed based on three page data P2_PD1 to P2_PD3. In this case, the fourth data latch DL4 connected to each bit line may be a free data latch in which page data associated with the second program operation is not stored. Thus, a program operation control unit 130 classifies the second program operation as a dump mode.

Figure 14:
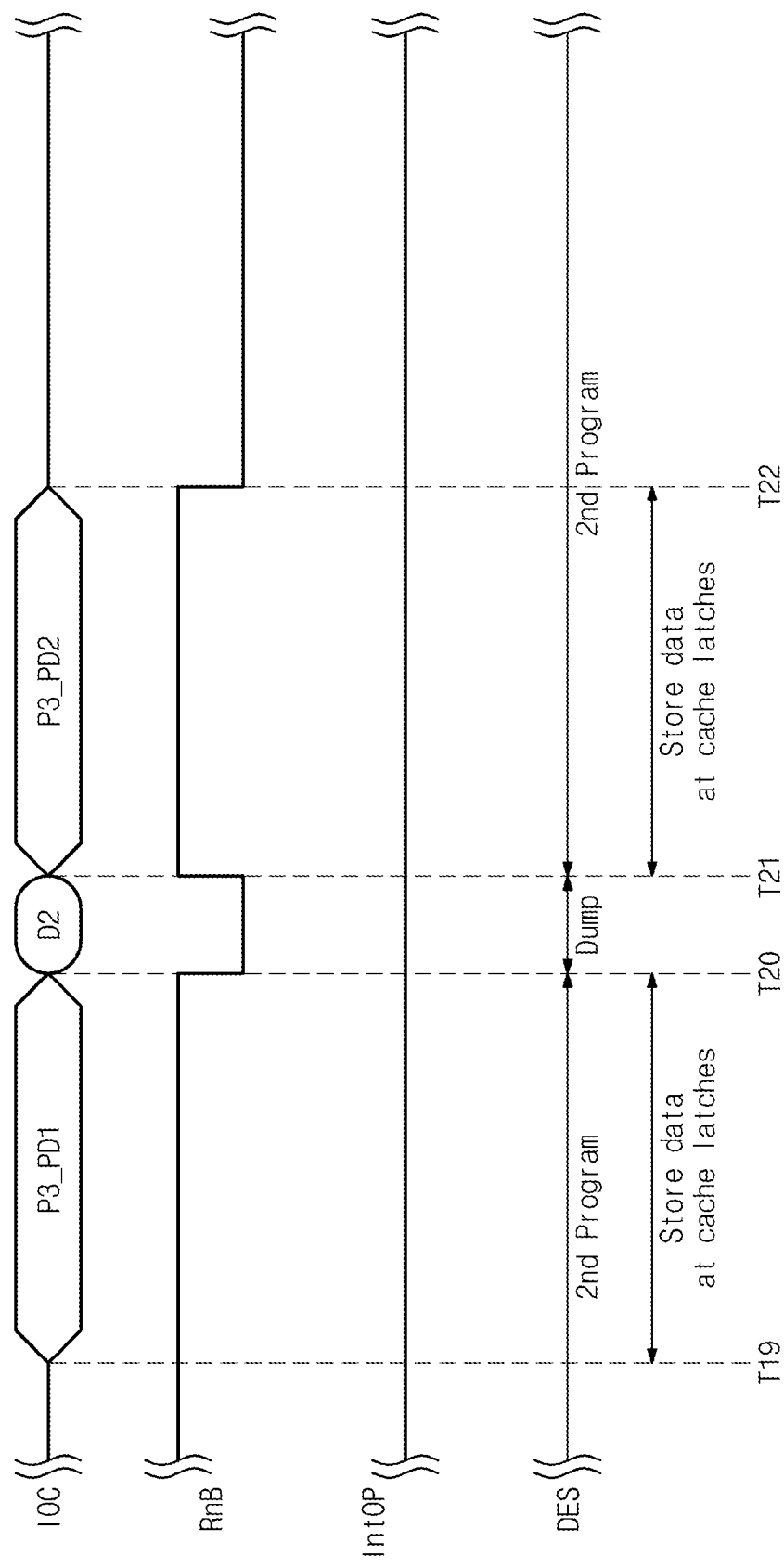
FIG. 14 is a timing diagram schematically illustrating an example of programming executed according to a method described with reference to FIGS. 5 to 7.
Figure 15:
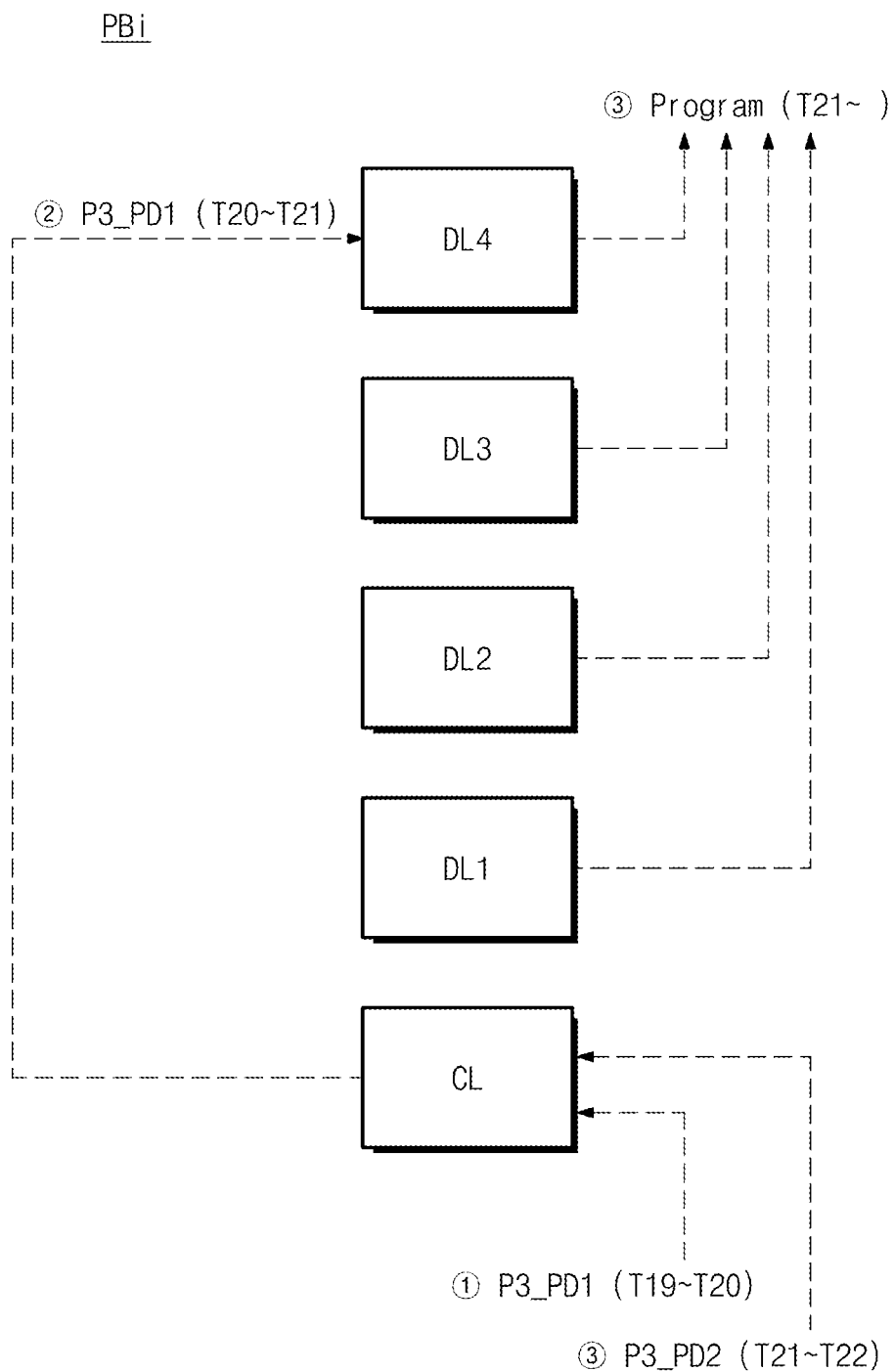
FIG. 15 is a block diagram schematically illustrating a data flow of data latches, connected to a bit line, and a cache latch, when an example shown in FIG. 14 is performed.

FIG. 14 is a timing diagram schematically illustrating an example of programming executed according to a method described with reference to FIGS. 5 to 7. FIG. 14 shows an operation following an operation described with reference to FIG. 12. FIG. 15 is a block diagram schematically illustrating a data flow of data latches DL1 to DL4, connected to a bit line, and a cache latch CL, when an example shown in FIG. 14 is performed.

T19 and T20 may be any time after the second program operation is carried out and before the second program operation is ended. Between T19 and T20, a memory controller 120 transmits first page data P3_PD1 associated with a third program operation to a nonvolatile memory 110. The first page data P3_PD1 may be loaded onto cache latches CL of the nonvolatile memory 110 (①).

T21 may be any time after the second program operation is carried out and before the second program operation is ended.

Between T20 and T21, the memory controller 120 issues a second dump command D2 to the nonvolatile memory 110. In response to the second dump command D2, the nonvolatile memory 110 dumps the first page data P3_PD1 stored in the cache latches CL onto fourth data latches DL4 as free data latches (②).

For example, the nonvolatile memory 110 suspends the second program operation and dumps the first page data P3_PD1. The nonvolatile memory 110 may have dumping points the number of which is desired (and/or alternatively predetermined). A dumping point may be a point where programming is able to be suspended and resumed without influence on the programming. If the second dump command D2 is received, at a dumping point being the first to arrive, the nonvolatile memory 110 suspends the second program operation and dumps the first page data P3_PD1.

As another example, the nonvolatile memory 110 may dump the first page data P3_PD1 during the second program operation. The nonvolatile memory 110 may have dumping points the number of which is desired (and/or alternatively predetermined). A dumping point may be a point where dumping is able to be made in parallel with programming without influence on the programming. If the second dump command D2 is received, at a dumping point being the first to arrive, the nonvolatile memory 110 dumps the first page data P3_PD1 in parallel with the second program operation.

For ease of description, a non-limiting example will be described under the assumption that programming is suspended, dumping is performed, and programming is resumed. However, example embodiments are not limited thereto.

The second dump command D2 is a command that is transferred to the nonvolatile memory 110 while a program operation (e.g., a second program operation) is executed. For example, the second dump command D2 may be different from a command that is transferred to the nonvolatile memory 110 while a program operation is not executed. When a ready/busy signal RnB indicates a busy state (e.g., a low level) and a dump mode is identified, the memory controller 120 may issue the second dump command D2 to the nonvolatile memory 110. If the second dump command D2 is received, the nonvolatile memory 110 identifies the dump mode. In response to the second dump command D2, the nonvolatile memory 110 dumps data stored in the cache latches CL onto the fourth data latches DL4 being free data latches.

As another example, the second dump command D2 may be the same as a first dump command D1. When a ready/busy signal RnB indicates a busy state (e.g., a low level) and a dump mode is identified, the memory controller 120 issues the second dump command D2 to the nonvolatile memory 110. If the second dump command D2 is received, the nonvolatile memory 110 identifies the dump mode, based on an internal operation IntOP and whether or not a part of data latches DL1 to DL4 is free. When the dump mode is identified, the nonvolatile memory 110 dumps data stored in the cache latches CL onto the fourth data latches DL4 being free data latches in response to the second dump command D2.

During a transfer of the first page data P3_PD1, the nonvolatile memory 110 outputs the ready/busy signal RnB having a low level indicating a busy state. An internal operation IntOP has a busy state (e.g., a high level) while the first page data P3_PD1 is dumped.

If the first page data P3_PD1 is dumped onto the fourth data latches DL4, free data latches don't exist. Thus, when the second dump command D2 is issued to the nonvolatile memory 110, a program operation control unit 130 identifies that a dump mode is switched into a normal mode.

The cache latches CL are empty when the first page data P3_PD1 is all dumped. Since the nonvolatile memory 110 is able to receive data from the memory controller 120, it sets the ready/busy signal RnB to a ready state (e.g., a high level).

T22 may be any time after the second program operation is carried out and before the second program operation is ended. If the first page data P3_PD1 is all dumped, at T22, the nonvolatile memory 110 resumes the second program operation.

Between T21 and T22, the memory controller 120 transmits second page data P3_PD2 associated with the third program operation to the nonvolatile memory 110. The memory controller 120 transmits the second page data P3_PD2 to the nonvolatile memory 110 in response to a low-to-high transition of the ready/busy signal RnB. The second page data P3_PD2 may be loaded onto the cache latches CL of the nonvolatile memory 110 (③). If the second page data P3_PD2 is all loaded onto the cache latches CL, the ready/busy signal RnB is set to a busy state (e.g., a low level) under a control of the nonvolatile memory 110.

Figure 16:
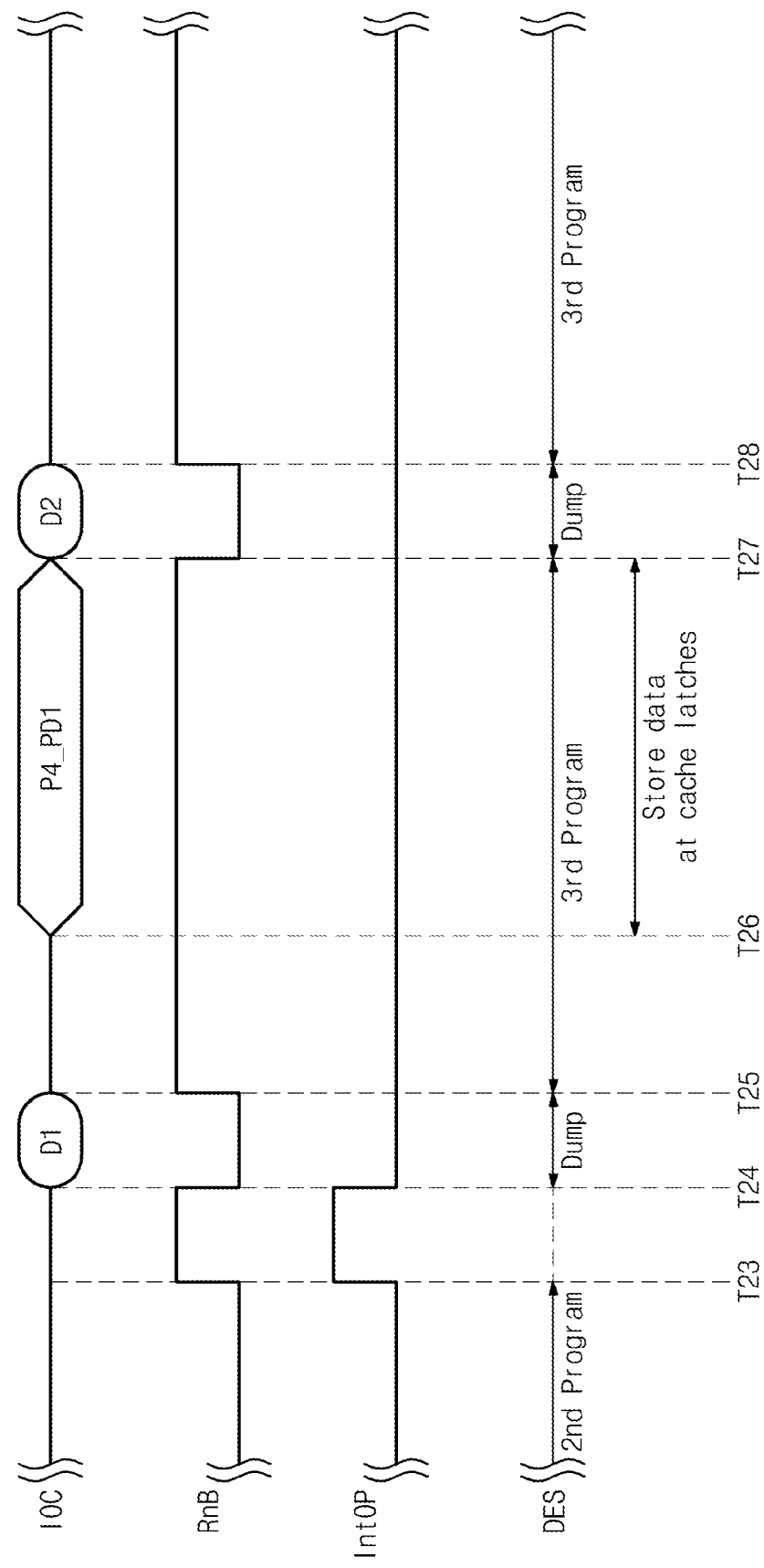
FIG. 16 is a timing diagram schematically illustrating an example programming executed according to a method described with reference to FIGS. 5 to 7.
Figure 17:
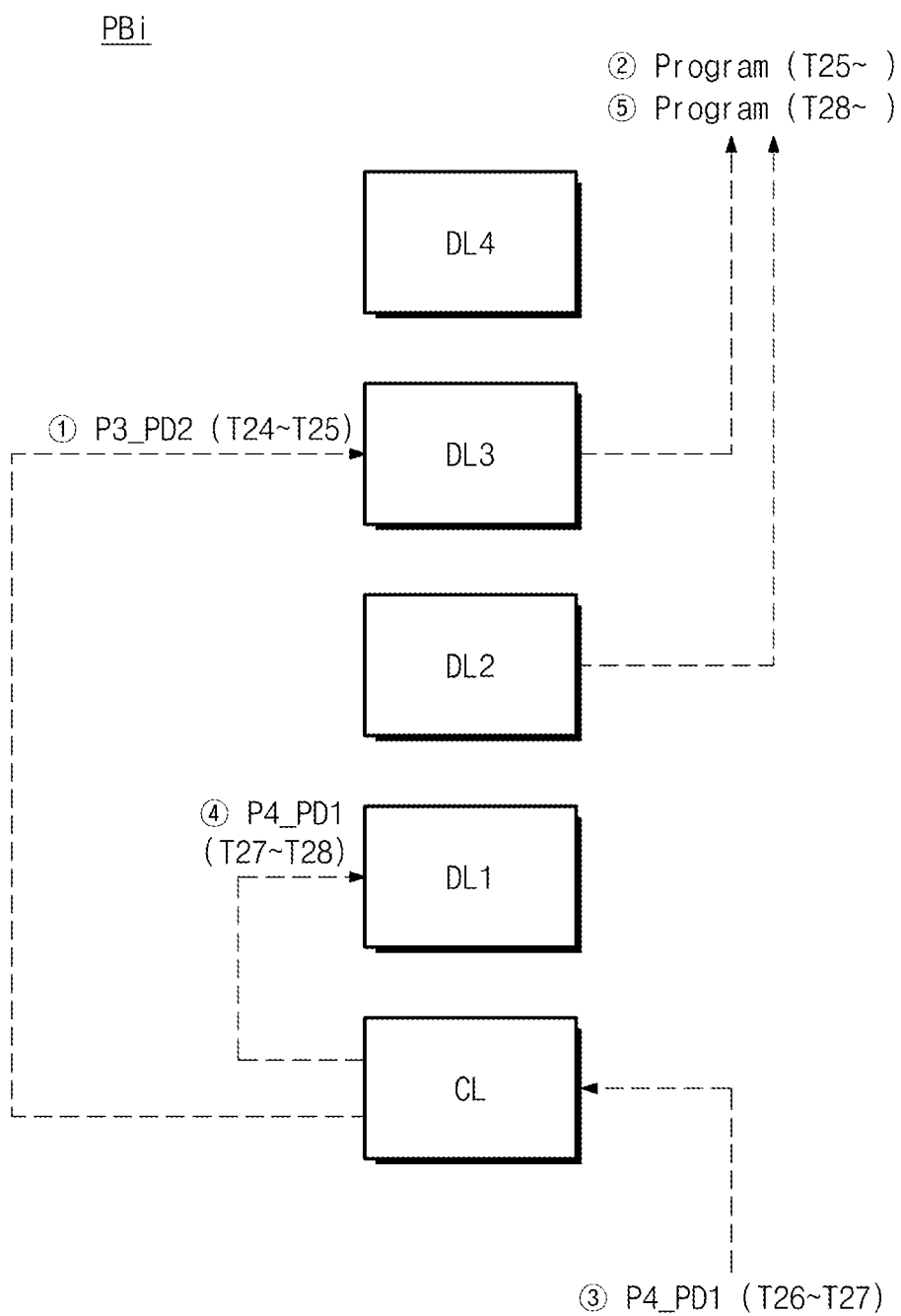
FIG. 17 is a block diagram schematically illustrating a data flow of data latches DL1 to DL4, connected to a bit line, and a cache latch CL, when an example shown in FIG. 16 is performed.

FIG. 16 is a timing diagram schematically illustrating an example of programming executed according to a method described with reference to FIGS. 5 to 7. FIG. 16 shows an operation following an operation described with reference to FIG. 14. FIG. 17 is a block diagram schematically illustrating a data flow of data latches DL1 to DL4, connected to a bit line, and a cache latch CL, when an example shown in FIG. 16 is performed.

Referring to FIGS. 1, 16, and 17, at T23, a second program operation is ended. At this time, a ready/busy signal RnB is set to a ready state (e.g., a high level), and an internal operation IntOP of a nonvolatile memory 110 has a ready state (e.g., a high level).

Between T24 and T25, a memory controller 120 issues a dump command D1 to the nonvolatile memory 110 in response to the ready/busy signal RnB having a ready state. In response to the dump command D1, the nonvolatile memory 110 dumps the second page data P3_PD2 stored in the cache latches CL onto third data latches DL3 (①). Under a control of the nonvolatile memory 110, the ready/busy signal RnB is set to a busy state (e.g., a low level) while the second page data P3_PD2 is dumped. The internal operation IntOP of the nonvolatile memory 110 has a low level indicating a busy state while the second page data P3_PD2 is dumped.

In case of a dump mode, during the second program operation, the memory controller 120 provides the nonvolatile memory 110 with two or more pages of data associated with the third program operation following a second program operation. The memory controller 120 issues at least one second dump command D2 to the nonvolatile memory 110. With the above description, during the second program operation, two or more pages of data associated with the third program operation are loaded onto the nonvolatile memory 110, thereby reducing an execution time of programming associated with the third program operation.

The third program operation may be a program operation based on first and second page data P3_PD1 and P3_PD2. For example, the third program operation may be a program operation about memory cells of a second memory block BLK2 (refer to FIG. 2) having a 2-level. When the second page data P3_PD2 is loaded onto the nonvolatile memory 110, all page data for the third program operation may be loaded onto the nonvolatile memory 110. Thus, at T25, the nonvolatile memory 110 starts the third program operation based on the first and second page data P3_PD1 and P3_PD2 (②).

If the second page data P3_PD2 is all dumped, at T25, the nonvolatile memory 110 sets the ready/busy signal RnB to a ready state (e.g., a high level). If the third program operation commences, at T25, the internal operation IntOP of the nonvolatile memory 110 retains a busy state (e.g., a low level). The internal operation IntOP of the nonvolatile memory 110 retains the busy state (e.g., a low level) until the third program operation is ended.

The number of data latches DL1 to DL4 connected to a bit line BL is 4. The second program operation is performed based on two page data P3_PD1 and P3_PD2. In this case, the first and second data latches DL1 and DL2 connected to each bit line may be free data latches in which page data associated with the third program operation is not stored. Thus, a program operation control unit 130 classifies the third program operation as a dump mode.

T26 and T27 may be any time after the third program operation is carried out and before the third program operation is ended. Between T26 and T27, the memory controller 120 transmits first page data P4_PD1 associated with a fourth program operation to the nonvolatile memory 110. The first page data P4_PD1 may be loaded onto the cache latches CL of the nonvolatile memory 110 (③).

T28 may be any time after the third program operation is carried out and before the third program operation is ended. Between T27 and T28, the memory controller 120 issues the second dump command D2 to the nonvolatile memory 110. The nonvolatile memory 110 dumps the first page data P4_PD1 loaded onto the cache latches CL onto first data latches DL1 in response to the second dump command D2 (④). For example, the nonvolatile memory 110 suspends the third program operation and dumps the first page data P4_PD1.

During a transfer of the first page data P4_PD1, the nonvolatile memory 110 sets the ready/busy signal RnB to a busy state (e.g., a high level). The internal operation IntOP of the nonvolatile memory 110 has a busy state (e.g., a low level) while the first page data P4_PD1 is dumped.

The cache latches CL are empty when the first page data P4_PD1 is all dumped. Since the nonvolatile memory 110 is able to receive data from the memory controller 120, it sets the ready/busy signal RnB to a ready state (e.g., a high level).

If the first page data P4_PD1 is all dumped, the nonvolatile memory 110 resumes the third program operation (⑤).

Figure 18:
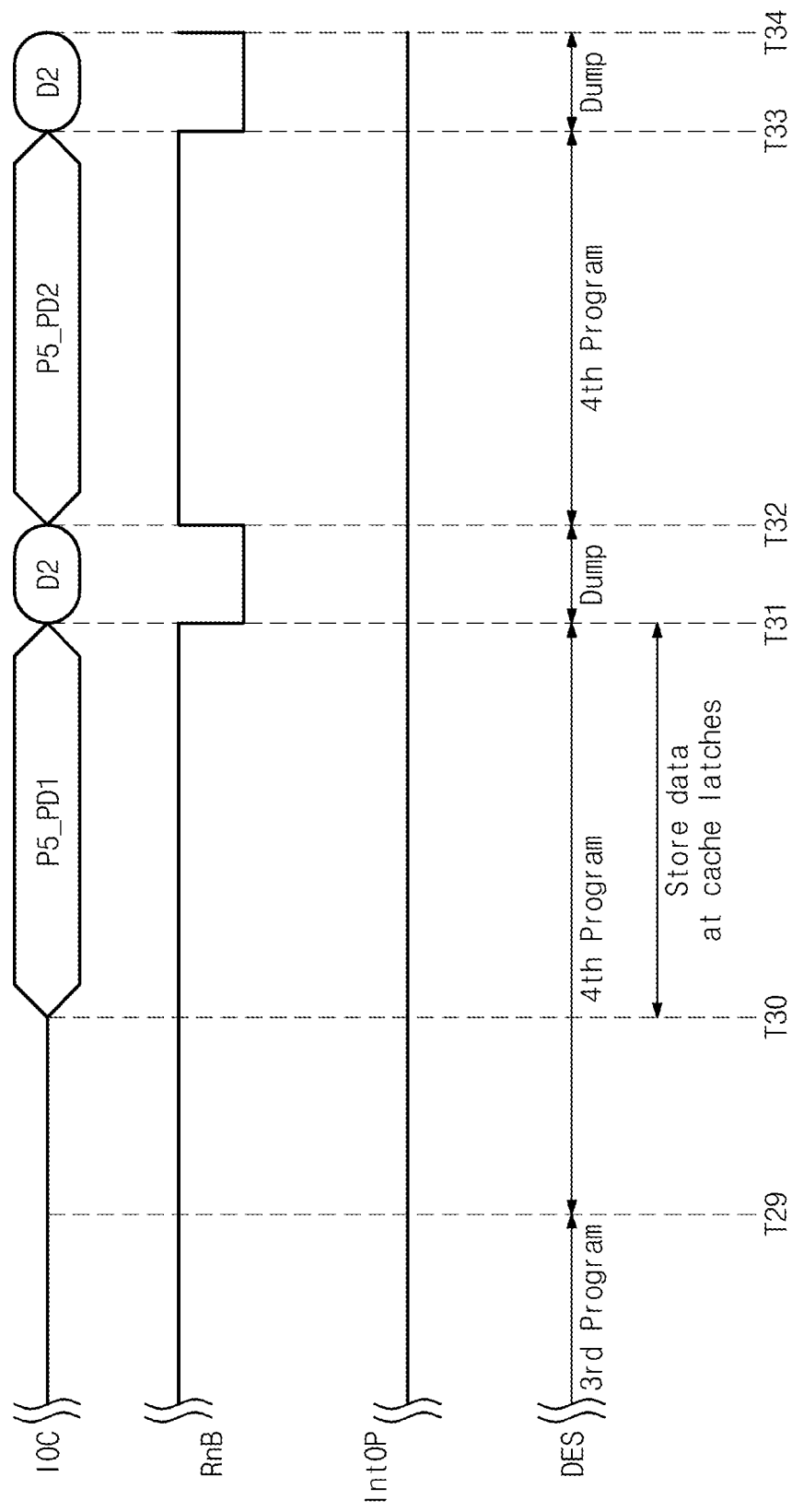
FIG. 18 is a timing diagram schematically illustrating an example of programming executed according to a method described with reference to FIGS. 5 to 7.
Figure 19:
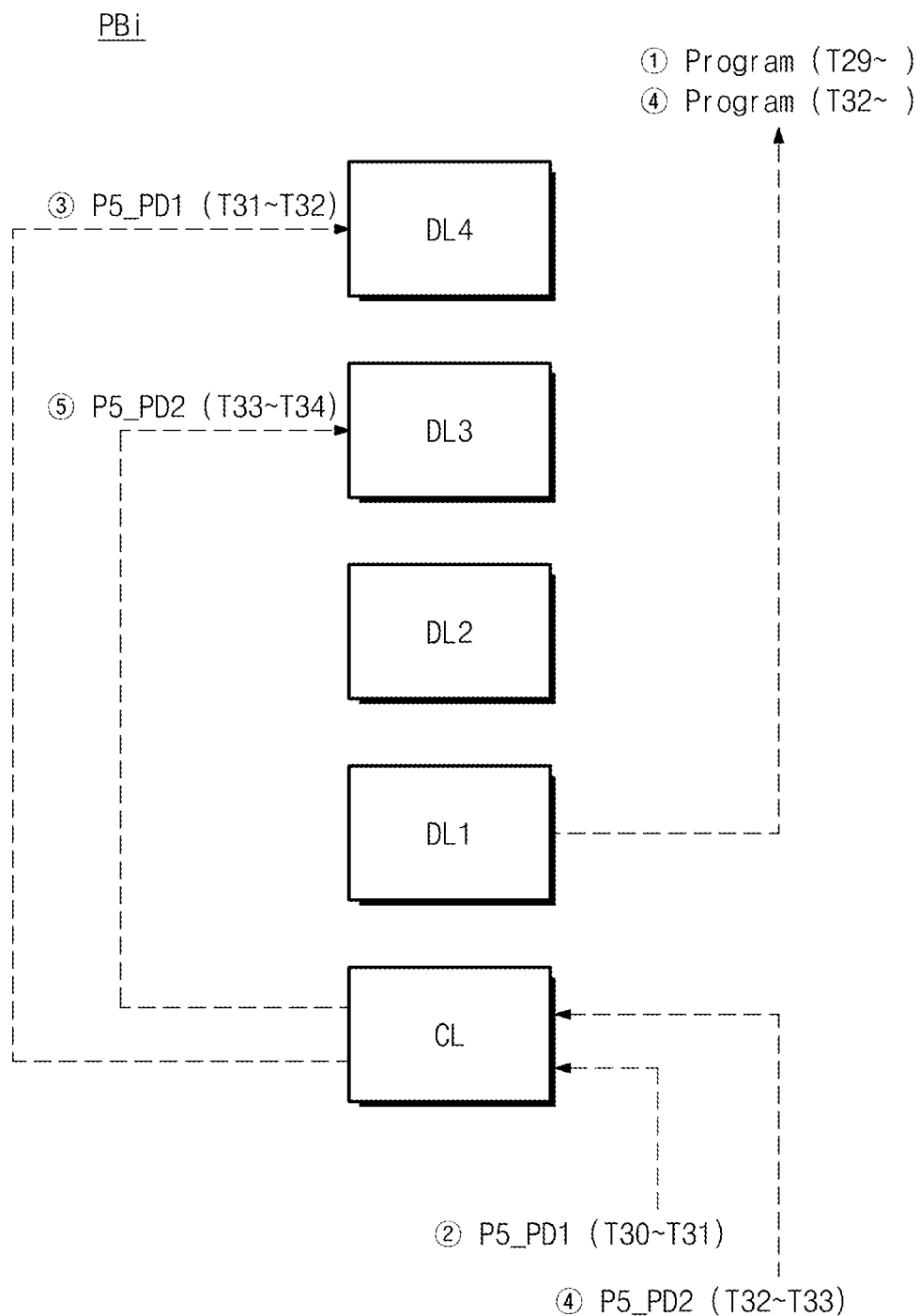
FIG. 19 is a block diagram schematically illustrating a data flow of data latches, connected to a bit line, and a cache latch, when an example shown in FIG. 18 is performed.

FIG. 18 is a timing diagram schematically illustrating a further embodiment of programming executed according to a method described with reference to FIGS. 5 to 7. FIG. 18 shows an operation following an operation described with reference to FIG. 16. FIG. 19 is a block diagram schematically illustrating a data flow of data latches DL1 to DL4, connected to a bit line, and a cache latch CL, when an example shown in FIG. 18 is performed.

Referring to FIGS. 1, 18, and 19, at T29, a third program operation is ended. At this time, a ready/busy signal RnB is set to a ready state (e.g., a high level), and an internal operation IntOP of a nonvolatile memory 110 has a ready state (e.g., a high level).

In example embodiments, the fourth program operation is executed based on first page data P4_PD1. For example, the fourth program operation may be a program operation about memory cells of a second memory block BLK3 (refer to FIG. 2) having a 1-level. The first page data P4_PD1 for the fourth program operation has been loaded in advance. Thus, if the third program operation is ended, at T29, the fourth program operation commences. A program operation control unit 130 classifies the fourth program operation as a dump mode.

In case of a dump mode, during the third program operation, the memory controller 120 provides the nonvolatile memory 110 with all pages of data associated with the fourth program operation following a third program operation, thereby reducing an execution time of programming associated with the fourth program operation.

T30 and T31 may be any time after the fourth program operation is carried out and before the fourth program operation is ended. Between T30 and T31, the memory controller 120 provides the nonvolatile memory 110 with first page data P5_PD1 associated with the fifth program operation. The first page data P5_PD1 is loaded onto the cache latches CL of the nonvolatile memory 110 (②).

T32 may be any time after the fourth program operation is carried out and before the fourth program operation is ended. Between T31 and T32, the memory controller 120 issues the second dump command D2 to the nonvolatile memory 110. The nonvolatile memory 110 dumps the first page data P5_PD1 loaded onto the cache latches CL onto fourth data latches DL4 being free data latches in response to the second dump command D2 (③). For example, the nonvolatile memory 110 suspends the fourth program operation and dumps the first page data P5_PD1.

The nonvolatile memory 110 sets the ready/busy signal RnB to a busy state (e.g., a low level) while the first page data P5_PD1 is dumped. The internal operation IntOP of the nonvolatile memory 110 has a busy state (e.g., a low level) while the first page data P5_PD1 is dumped.

The cache latches CL are empty when the first page data P5_PD1 is all dumped. Since the nonvolatile memory 110 is able to receive data from the memory controller 120, it sets the ready/busy signal RnB to a ready state (e.g., a high level).

If the first page data P5_PD1 is all dumped, the nonvolatile memory 110 resumes the fourth program operation (④).

T33 may be any time after the fourth program operation is carried out and before the fourth program operation is ended. Between T32 and T33, the memory controller 120 transmits second page data P5_PD2 associated with a fifth program operation to the nonvolatile memory 110. The second page data P5_PD2 may be loaded onto the cache latches CL of the nonvolatile memory 110 (④).

T34 may be any time after the fourth program operation is carried out and before the fourth program operation is ended. Between T33 and T34, the memory controller 120 issues the second dump command D2 to the nonvolatile memory 110. The nonvolatile memory 110 dumps the second page data P5_PD2 loaded onto the cache latches CL onto third data latches DL3 being free data latches in response to the second dump command D2 (⑤). For example, the nonvolatile memory 110 suspends the fourth program operation and dumps the second page data P5_PD2.

The nonvolatile memory 110 sets the ready/busy signal RnB to a busy state (e.g., a low level) while the second page data P5_PD2 is dumped. The internal operation IntOP of the nonvolatile memory 110 has a busy state (e.g., a low level) while the second page data P5_PD2 is dumped.

The cache latches CL are empty when the second page data P5_PD2 is all dumped. Since the nonvolatile memory 110 is able to receive data from the memory controller 120, it sets the ready/busy signal RnB to a ready state (e.g., a high level).

Figure 20:
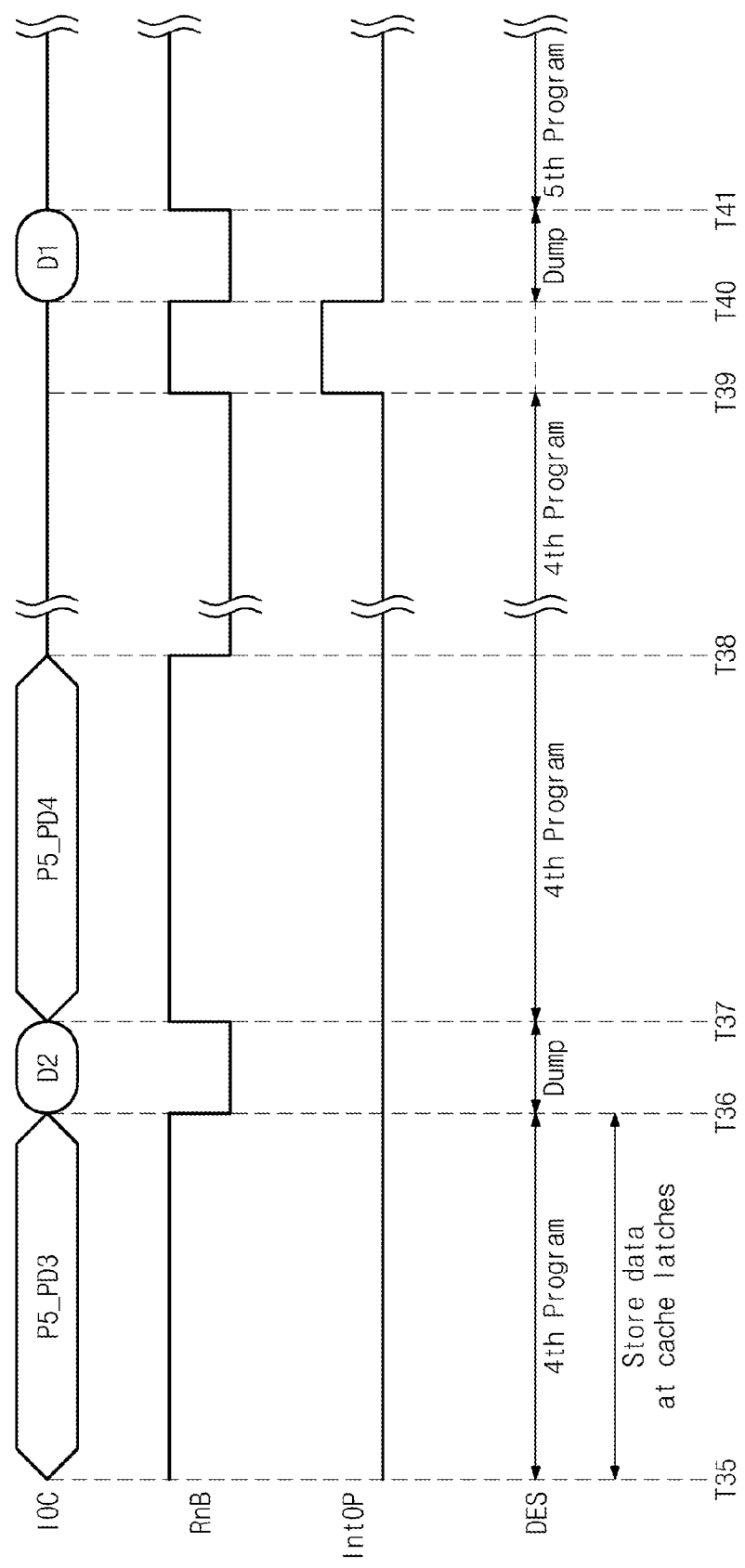
FIG. 20 is a timing diagram schematically illustrating an example of programming executed according to a method described with reference to FIGS. 5 to 7.
Figure 21:
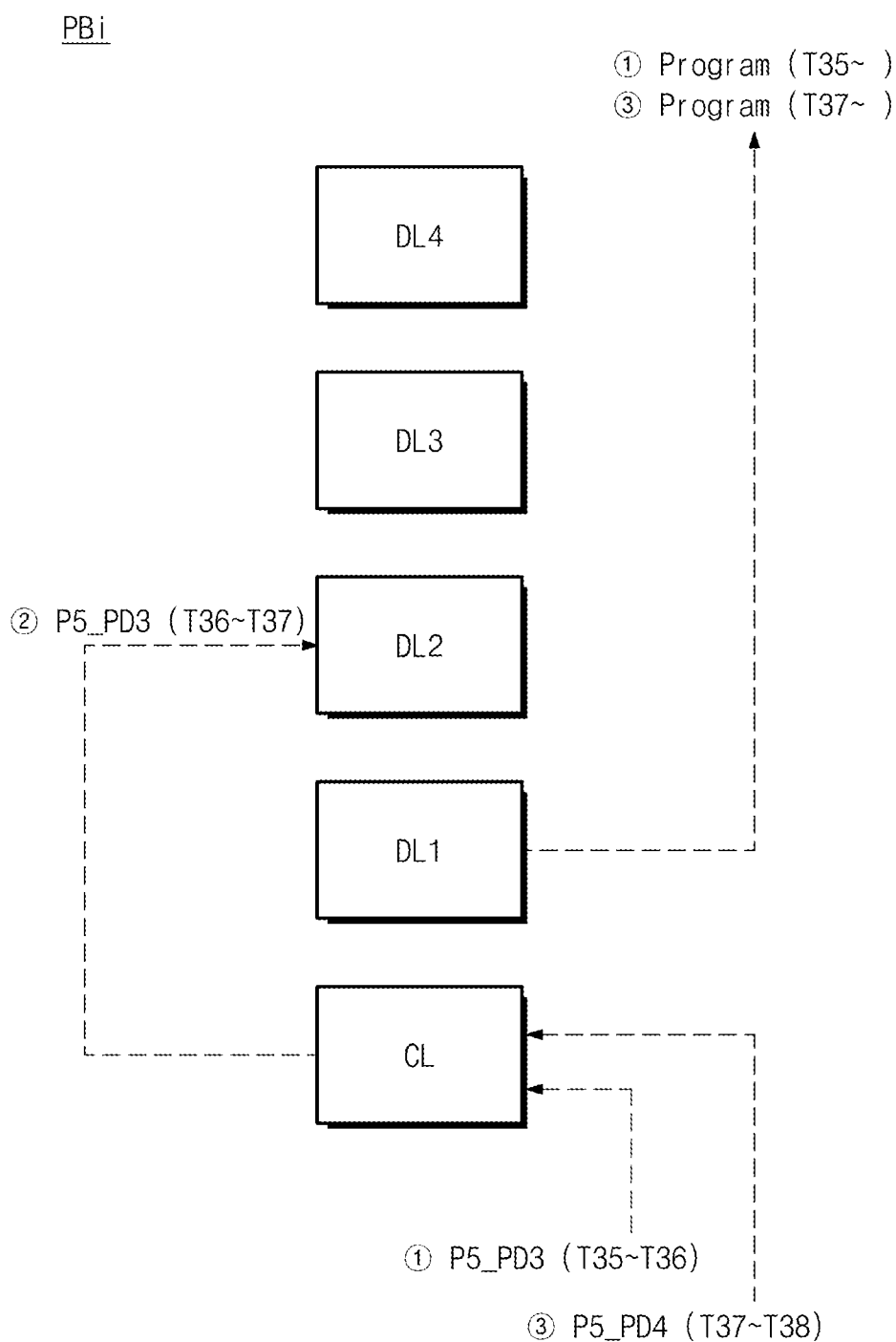
FIGS. 21 and 22 are block diagrams schematically illustrating a data flow of data latches, connected to a bit line, and a cache latch, when an example shown in FIG. 20 is performed.
Figure 22:
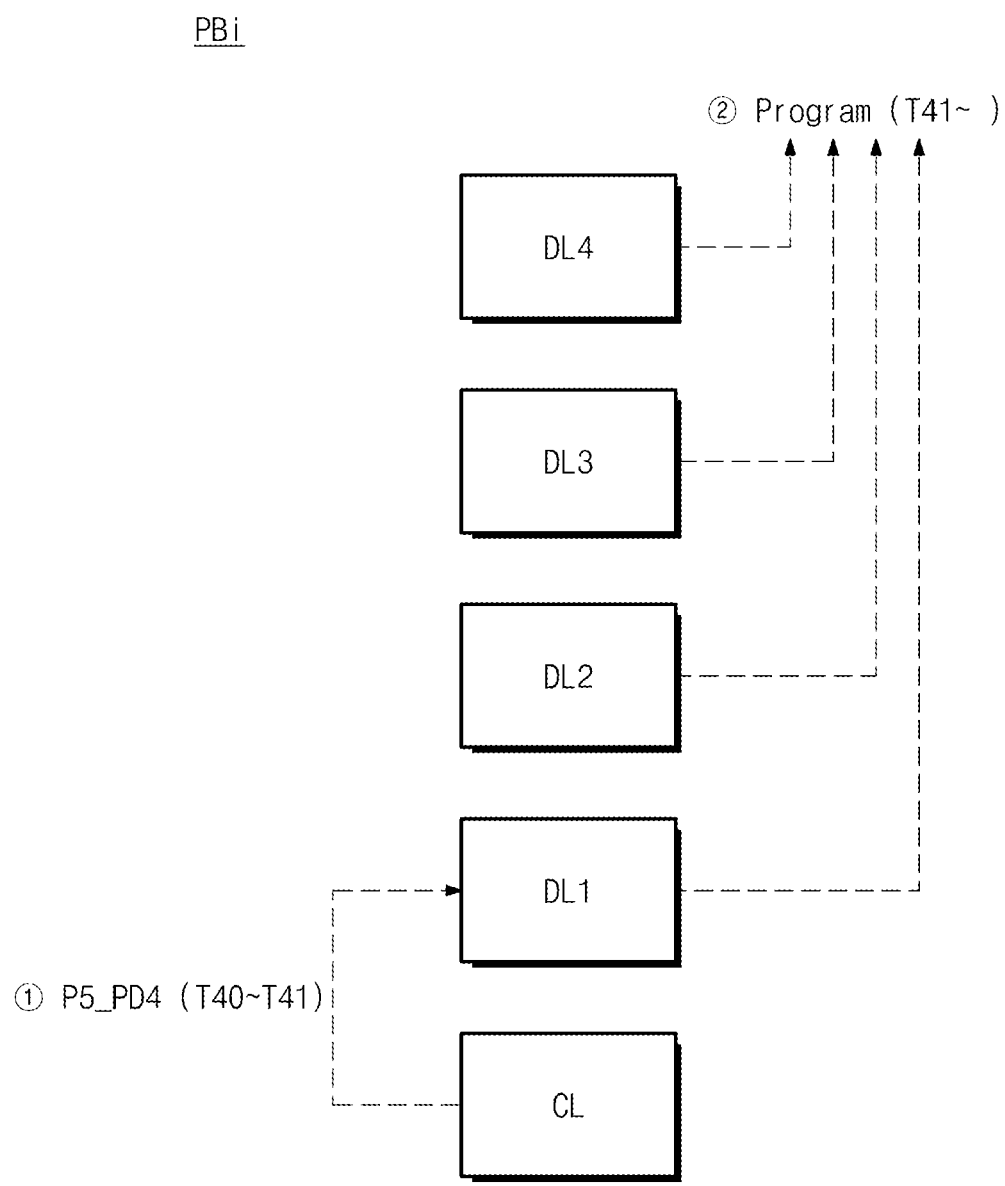

FIG. 20 is a timing diagram schematically illustrating still an example of programming executed according to a method described with reference to FIGS. 5 to 7. FIG. 20 shows an operation following an operation described with reference to FIG. 18. FIGS. 21 and 22 are block diagrams schematically illustrating a data flow of data latches DL1 to DL4, connected to a bit line, and a cache latch CL, when an example shown in FIG. 20 is performed.

Referring to FIGS. 1, 20, and 21, if second page data P5_PD2 is all dumped, at T35, a nonvolatile memory 110 resumes a fourth program operation (①).

T36 may be any time after the fourth program operation is carried out and before the fourth program operation is ended. Between T35 and T36, a memory controller 120 provides the nonvolatile memory 110 with third page data P5_PD3 associated with the fifth program operation. The third page data P5_PD3 is loaded onto the cache latches CL of the nonvolatile memory 110 (①).

T37 may be any time after the fourth program operation is carried out and before the fourth program operation is ended. Between T36 and T37, the memory controller 120 issues the second dump command D2 to the nonvolatile memory 110. The nonvolatile memory 110 dumps the third page data P5_PD3 loaded onto the cache latches CL onto second data latches DL2 being free data latches in response to the second dump command D2 (②). For example, the nonvolatile memory 110 suspends the fourth program operation and dumps the third page data P5_PD3.

If the third page data P5_PD3 is dumped onto the second data latches DL2, free data latches don't exist. Thus, if the second dump command D2 associated with the third page data P5_PD3 is sent to the nonvolatile memory 110, a program operation control unit 130 identifies that a dump mode is switched into a normal mode.

The nonvolatile memory 110 sets the ready/busy signal RnB to a busy state (e.g., a low level) while the third page data P5_PD3 is dumped. The internal operation IntOP of the nonvolatile memory 110 has a busy state (e.g., a low level) while the third page data P5_PD3 is dumped.

The cache latches CL are empty when the third page data P5_PD3 is all dumped. Since the nonvolatile memory 110 is able to receive data from the memory controller 120, it sets the ready/busy signal RnB to a ready state (e.g., a high level).

If the third page data P5_PD3 is all dumped, at T37, the nonvolatile memory 110 resumes the fourth program operation (③).

T38 may be any time after the fourth program operation is carried out and before the fourth program operation is ended. Between T37 and T38, the memory controller 120 transmits fourth page data P5_PD4 associated with a fifth program operation to the nonvolatile memory 110. The fourth page data P5_PD4 may be loaded onto the cache latches CL of the nonvolatile memory 110 (③).

At T39, the fourth program operation is ended. At this time, the ready/busy signal RnB is set to a ready state (e.g., a high level), and an internal operation IntOP of a nonvolatile memory 110 has a ready state (e.g., a high level).

Referring to FIGS. 1, 20, and 22, between T40 and T41, the memory controller 120 transmits a dummy command D1 to the nonvolatile memory 110 in response to the ready/busy signal RnB indicating a ready state. The fourth page data P5_PD4 loaded onto the cache latches CL of the nonvolatile memory 110 may be dumped onto first data latches DL1(①). The nonvolatile memory 110 sets the ready/busy signal RnB to a busy state (e.g., a low level) while the fourth page data P5_PD4 is dumped. The internal operation IntOP of the nonvolatile memory 110 has a busy state (e.g., a low level) while the fourth page data P5_PD4 is dumped.

In example embodiments, the fifth program operation may be a program operation based on first to fourth page data P5_PD1 to P5_PD4. For example, the fifth program operation may be a program operation about memory cells of a fourth memory block BLK4 (refer to FIG. 2) having a 4-level (e.g., a maximum level). When the fourth page data P5_PD4 is loaded onto the nonvolatile memory 110, at T41, the fifth program operation commences (②). Since free data latches don't exist, a program operation control unit 130 classifies a current mode as a normal mode.

As described above, memory blocks BLK1 to BLKz may have different levels. A normal mode may be identified when memory cells of memory block having a maximum level are programmed. At a normal mode, a memory controller 120 loads a page of data for use in next programming onto a nonvolatile memory 110. A dump mode may be identified when memory cells of a memory block having a lower level than the maximum level are programmed. At a dump mode, the memory controller 120 may load at least one and/or two or more pages of data for use in next programming onto the nonvolatile memory 110. The memory controller 120 issues at least one dump command to the nonvolatile memory 110. That is, a following program operation based on a normal mode and a dump mode is executed according to a level of a memory block at which programming is being performed. Thus, it is possible to improve an operating speed using a memory system and a program method according to the inventive concept.

In the above description of FIGS. 8 to 22, the terms "upcoming program operation" and "following program operation" may refer to two consecutive program operations, where the following operation may be scheduled to occur after the upcoming program operation. For example, referring to FIGS. 8-15, the first program operation may be the upcoming program operation and the second program operation may be the following program operation. Additionally, referring to FIGS. 12-18, the second program operation may be the upcoming program operation and the third program operation may be the following program operation. Referring to FIGS. 16-20, the third program operation may be the upcoming program operation and the fourth program operation may be the following program operation. Referring to FIGS. 18-22, the fourth program operation may be the upcoming program operation and the fifth program operation may be the following program operation.

Figure 23:
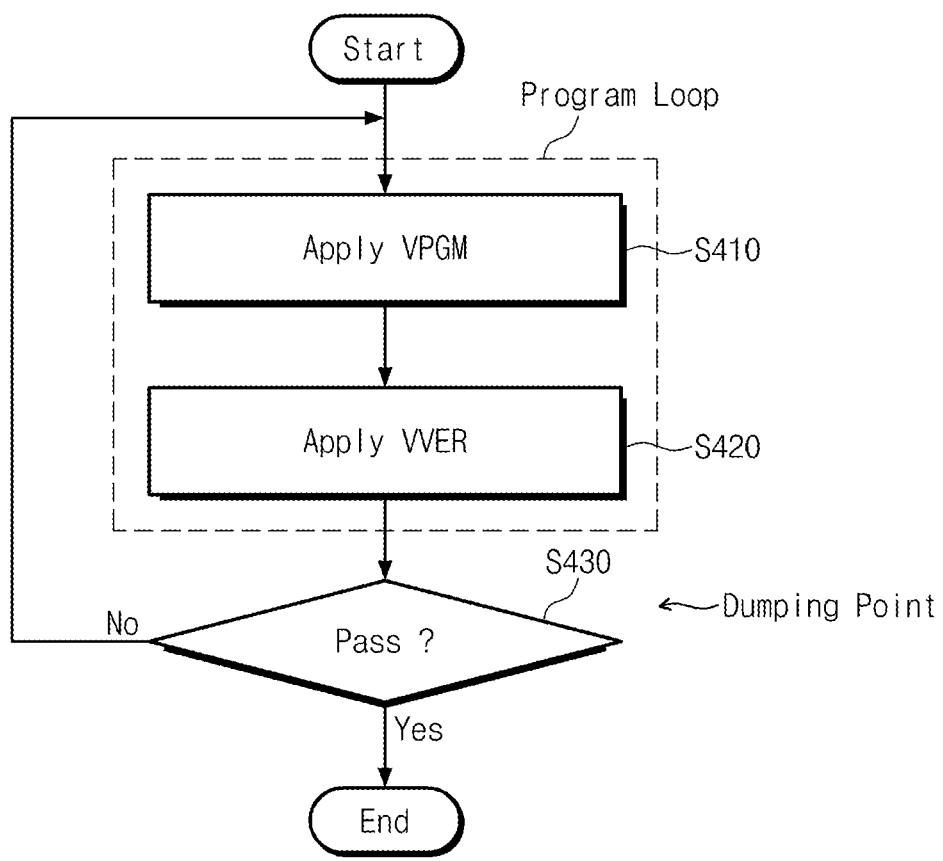
FIG. 23 is a flow chart for describing an example of dumping points.

FIG. 23 is a flow chart for describing an example of dumping points. In FIG. 23, there is illustrated a flow chart where programming is executed. Referring to FIGS. 2, 3, and 23, in step S410, a program voltage VPGM is applied. A nonvolatile memory 110 applies the program voltage VPGM to a word line (hereinafter, referred to as a selected word line), corresponding to an address ADDR, from among word lines WL1 to WLm. The nonvolatile memory 110 applies a program pass voltage VPASS to remaining word lines (hereinafter, referred to as unselected word lines).

In step S420, a verification voltage VVER is applied. The nonvolatile memory 110 applies the verification voltage VVER to the selected word line and a read voltage VREAD to the unselected word lines. The nonvolatile memory 110 pre-charges bit lines BL1 to BLn with a power supply voltage and then floats the bit lines BL1 to BLn. The nonvolatile memory 110 senses voltages on the bit lines BL1 to BLn.

In step S430, whether or not programming is passed is determined, based on a result of sensing the bit lines BL1 to BLn. When a result of sensing the bit lines BL1 to BLn indicates program pass, programming is ended. If a result of sensing the bit lines BL1 to BLn indicates program failure, steps S410 to S430 are again performed. For example, after the program voltage VPGM increases by a desired (and/or alternatively predetermined) increment, steps S410 to S430 are again performed.

Steps S410 and S420 may form a program loop. That is, program loops that are iteratively performed may constitute programming. Points between program loops may be used as dumping points. If a second dump command D2 is received, the nonvolatile memory 110 terminates a running program loop and performs dumping. If the dumping is ended, the nonvolatile memory 110 starts a next program loop. If the second dump command D2 is received, the nonvolatile memory 110 determines program pass or failure based on a result of sensing the bit lines BL1 to BLn and simultaneously performs dumping.

Dumping points described with reference to FIG. 23 are a non-limiting example. However, example embodiments are not limited to the example described with reference to FIG. 23.

Figure 24:
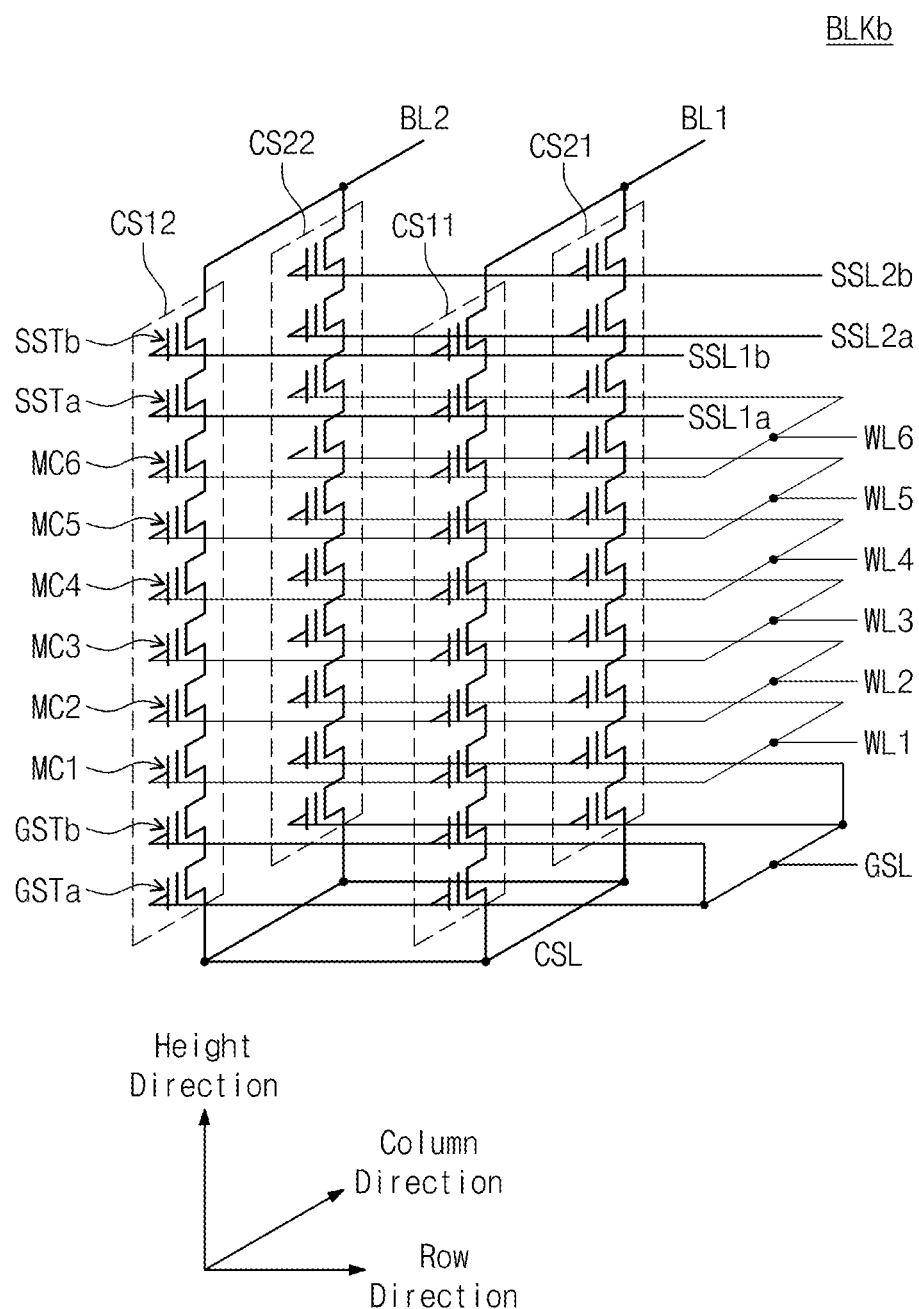
FIG. 24 is a circuit diagram schematically illustrating a memory block according to example embodiments.

FIG. 24 is a circuit diagram schematically illustrating a memory block BLKb according to example embodiments. Referring to FIG. 24, a memory block BLKb includes a plurality of cell strings CS11 to CS21 and CS12 to CS22. The plurality of cell strings CS11 to CS21 and CS12 to CS22 are arranged along a row direction and a column direction and form rows and columns.

For example, the cell strings CS11 and CS12 arranged along the row direction form a first row, and the cell strings CS21 and CS22 arranged along the row direction form a second row. The cell strings CS11 and CS21 arranged along the column direction form a first column, and the cell strings CS12 and CS22 arranged along the column direction form a second column.

Each cell string includes a plurality of cell transistors, which include ground selection transistors GSTa and GSTb, memory cells MC1 to MC6, and string selection transistors SSTa and SSTb. The ground selection transistors GSTa and GSTb, memory cells MC1 to MC6, and string selection transistors SSTa and SSTb of each cell string are stacked in a height direction perpendicular to a plane (for example, a plane above a substrate of the memory block BLKb) on which the cell strings CS11 to CS21 and CS12 to CS22 are arranged along rows and columns.

Lowermost ground selection transistors GSTa are connected in common to a common source line CSL.

The ground selection transistors GSTa and GSTb of the plurality of cell strings CS11 to CS21 and CS12 to CS22 are connected in common to a ground selection line GSL.

In example embodiments, ground selection transistors with the same height (or, order) may be connected to the same ground selection line, and ground selection transistors with different heights (or, orders) may be connected to different ground selection lines. For example, the ground selection transistors GSTa with a first height are connected in common to a first ground selection line, and the ground selection transistors GSTb with a second height are connected in common to a second ground selection line.

In example embodiments, ground selection transistors in the same row may be connected to the same ground selection line, and ground selection transistors in different rows may be connected to different ground selection lines. For example, the ground selection transistors GSTa and GSTb of the cell strings CS11 and CS12 in the first row are connected in common to the first ground selection line, and the ground selection transistors GSTa and GSTb of the cell strings CS21 and CS22 in the second row are connected in common to the second ground selection line.

Memory cells that are placed at the same height (or, order) from the substrate (or, the ground selection transistors GST) are connected in common to a word line. Memory cells that are placed at different heights (or, orders) are connected to different word lines WL1 to WL6. For example, the memory cells MC1 are connected in common to the word line WL1, the memory cells MC2 are connected in common to the word line WL2, and the memory cells MC3 are connected in common to the word line WL3. The memory cells MC4 are connected in common to the word line WL4, the memory cells MC5 are connected in common to the word line WL5, and the memory cells MC6 are connected in common to the word line WL6.

In first string selection transistors SSTa, having the same height (or, order), of the cell strings CS11 to CS21 and CS12 to CS22, the first string selection transistors SSTa in different rows are connected to different string selection lines SSL1a and SSL2a. For example, the first string selection transistors SSTa of the cell strings CS11 and CS12 are connected in common to the string selection line SSL1a, and the first string selection transistors SSTa of the cell strings CS21 and CS22 are connected in common to the string selection line SSL2a.

In second string selection transistors SSTb, having the same height (or, order), of the cell strings CS11 to CS21 and CS12 to CS22, the second string selection transistors SSTb in different rows are connected to the different string selection lines SSL1a and SSL2a. For example, the second string selection transistors SSTb of the cell strings CS11 and CS12 are connected in common to the string selection line SSL1b, and the second string selection transistors SSTb of the cell strings CS21 and CS22 are connected in common to the string selection line SSL2b.

That is, cell strings in different rows may be connected to different strings selection lines. String selection transistors, having the same height (or, order), of cell strings in the same row are connected to the same string selection line. String selection transistors, having different heights (or, orders), of cell strings in the same row are connected to different string selection lines.

In example embodiments, string selection transistors of cell strings in the same row are connected in common to a string selection line. For example, string selection transistors SSTa and SSTb of cell strings CS11 and CS12 in the first row are connected in common to a string selection line, and string selection transistors SSTa and SSTb of cell strings CS21 and CS22 in the second row are connected in common to a string selection line.

Columns of the cell strings CS11 to CS21 and CS12 to CS22 are connected to different bit lines BL1 and BL2, respectively. For example, string selection transistors SSTb of the cell strings CS11 and CS21 in the first column are connected in common to the bit line BL1, and string selection transistors SSTb of the cell strings CS12 and CS22 in the second column are connected in common to the bit line BL2.

The memory block BLKb shown in FIG. 24 is a non-limiting example, but example embodiments are not limited thereto. For example, the number of rows of cell strings may increase or decrease. As the number of rows of cell strings is changed, the number of string or ground selection lines and the number of cell strings connected to a bit line may also be changed.

The number of columns of cell strings may increase or decrease. As the number of columns of cell strings is changed, the number of bit lines connected to columns of cell strings and the number of cell strings connected to a string selection line may also be changed.

A height of the cell strings may increase or decrease. For example, the number of ground selection transistors, memory cells, or string selection transistors that are stacked in each cell string may increase or decrease. For example, each cell string may have more or fewer than six memory cells MC1 to MC6 stacked on top of each other.

In example embodiments, a write and a read operation may be performed by a row unit. For example, the cell strings CS11 to CS21 and CS12 to CS22 may be selected by the row through the string selection lines SSL1a, SSL1b, SSL2a, and SSL2b.

In a selected row of cell strings CS11 to CS21 and CS12 to CS22, a write or a read operation may be performed by the word line. In a selected row of cell strings CS11 to CS21 and CS12 to CS22, memory cells connected to a selected word line may be programmed.

Figure 25:
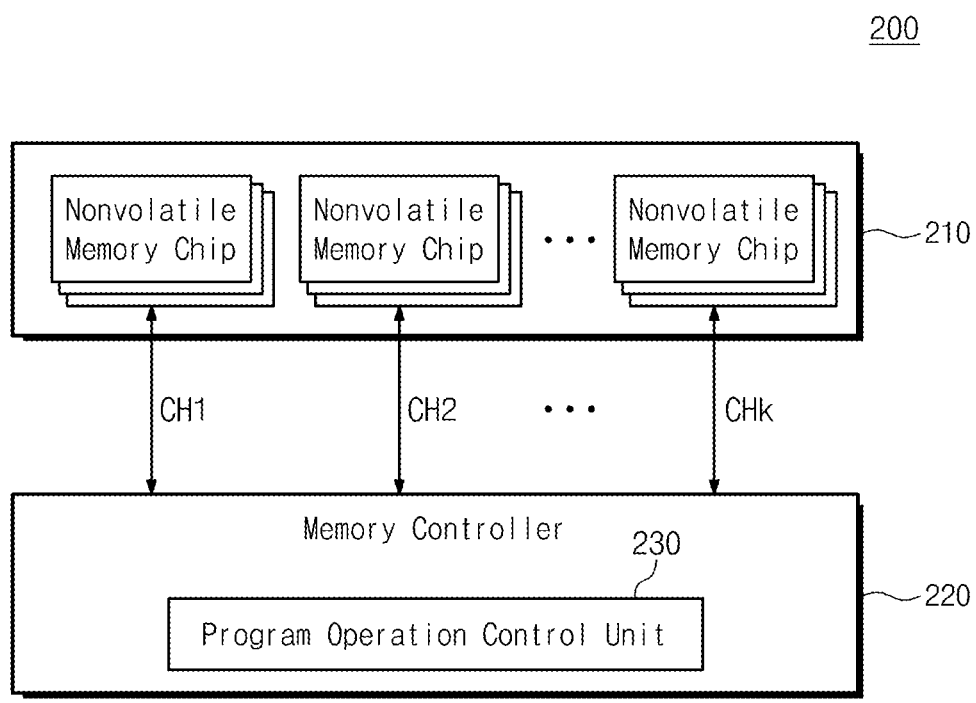
FIG. 25 is a block diagram schematically illustrating a memory system according to example embodiments.

FIG. 25 is a block diagram schematically illustrating a memory system 200 according to example embodiments. Referring to FIG. 25, a memory system 200 includes a nonvolatile memory 210 and a memory controller 220. The nonvolatile memory 210 includes a plurality of nonvolatile memory chips, which are divided into a plurality of groups. Nonvolatile memory chips in each group are configured to communicate with the memory controller 220 through a common channel. For example, the nonvolatile memory chips communicate with the memory controller 220 through channels CH1 to CHk.

In FIG. 25, there is illustrated an example where a plurality of nonvolatile memory chips are connected to a channel. The memory system 200 may be changed such that a nonvolatile memory chip is connected to a channel.

The memory controller 220 includes a program operation control unit 230. That is, the memory controller 220 identifies a normal mode or a dump mode while programming of the nonvolatile memory 210 is executed. The memory controller 220 loads page data associated with a following program operation onto the nonvolatile memory 210 according to the identified mode. During the normal mode, the memory controller 220 loads a page of data associated with a following program operation onto the nonvolatile memory 210. During the dump mode, the memory controller 220 loads two or more pages of data associated with a following program operation onto the nonvolatile memory 210 and issues at least one dump command associated with the following program operation to the nonvolatile memory 210.

Figure 26:
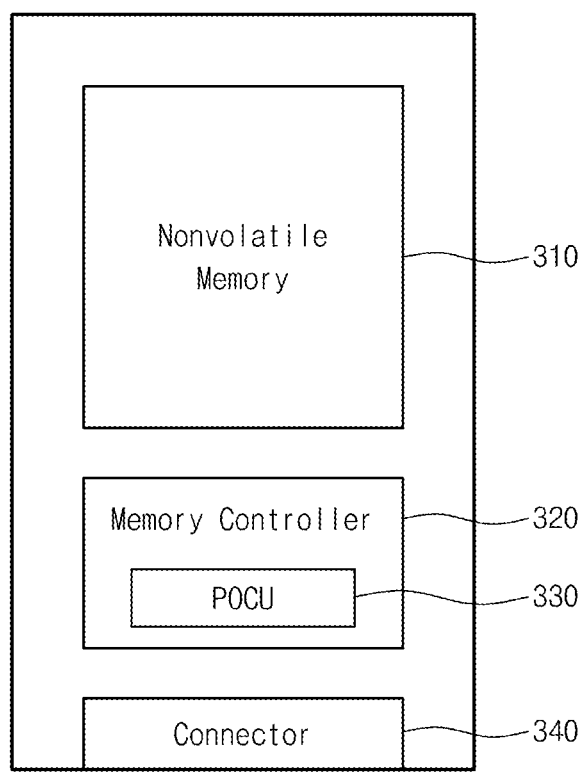
FIG. 26 is a block diagram schematically illustrating a storage module according to example embodiments.

FIG. 26 is a block diagram schematically illustrating a storage module 300 according to example embodiments. Referring to FIG. 26, a storage module 300 includes a nonvolatile memory 310, a memory controller 320, and a connector 340.

The memory controller 320 includes a program operation control unit 230. That is, the memory controller 320 identifies a normal mode or a dump mode while programming of the nonvolatile memory 310 is executed. The memory controller 320 loads page data associated with a following program operation onto the nonvolatile memory 310 according to the identified mode. During the normal mode, the memory controller 320 loads a page of data associated with a following program operation onto the nonvolatile memory 310. During the dump mode, the memory controller 320 loads two or more pages of data associated with a following program operation onto the nonvolatile memory 310 and issues at least one dump command associated with the following program operation to the nonvolatile memory 310.

The connector 340 connects the storage module 300 with an external device. The connector 340 may include a socket that complies with standards such as, but not limited to, SATA (Serial AT Attachment), eSATA, PCI (Peripheral Component Interconnect), PCI-e, SCSI (Small Computer System Interface), USB (Universal Serial Bus), Mini USB, Micro USB, Firewire, and so on. The connector 340 may include a connection means such as, but not limited to, PGA (Pin Grid Array), BGA (Ball Grid Array), and so on.

The storage module 300 may be formed of a variety storage modules, such as, but not limited to, a solid state drive (SSD), PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) module, an eMMC (embedded MMC) module, and the like.

Figure 27:
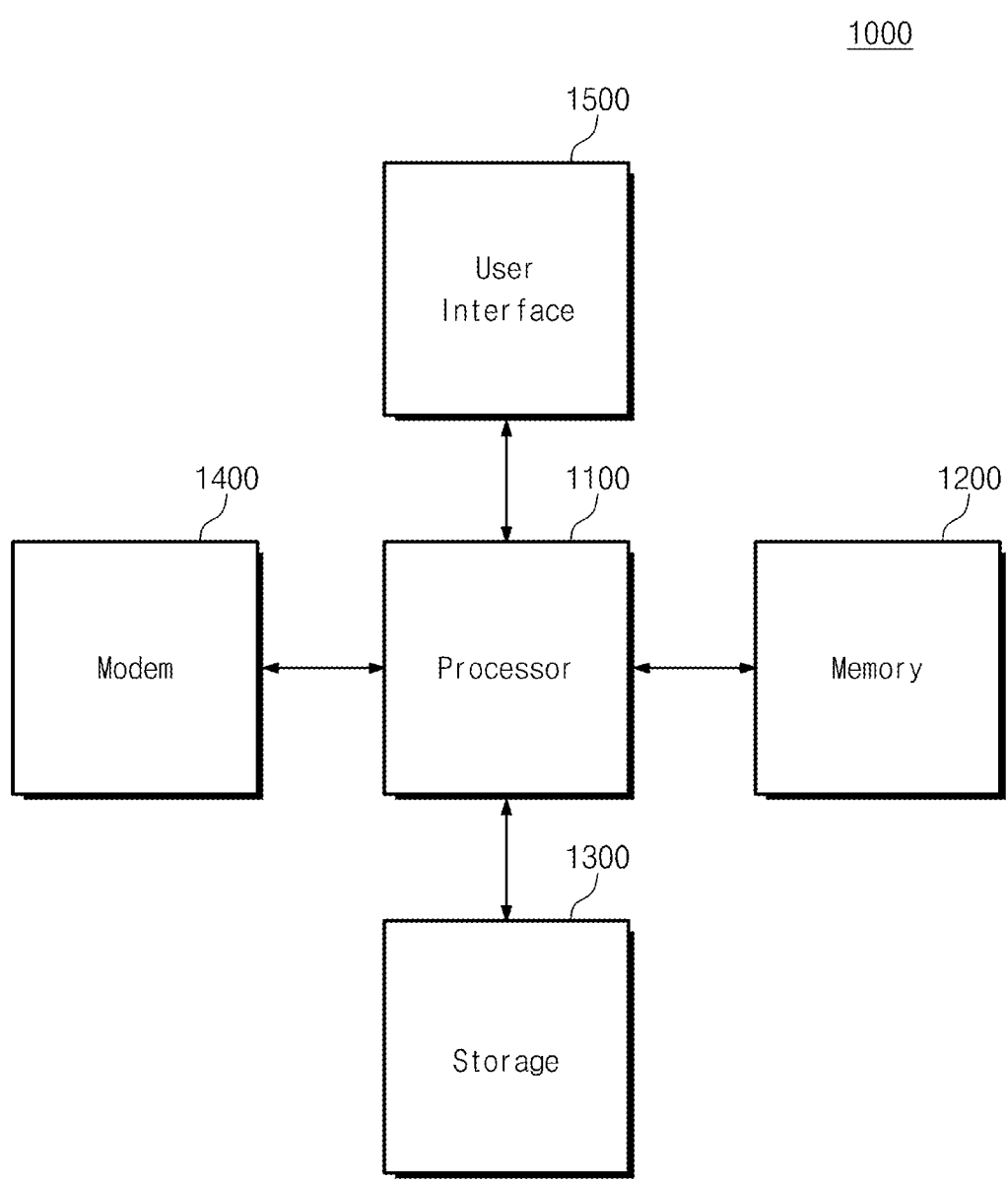
FIG. 27 is a block diagram schematically illustrating a computing device according to example embodiments.

FIG. 27 is a block diagram schematically illustrating a computing device 1000 according to example embodiments. Referring to FIG. 27, a computing device 1000 includes a processor 1100, a memory 1200, storage 1300, a modem 1400, and a user interface 1500.

The processor 1100 controls an overall operation of the computing device 1000 and may perform a logical operation. The processor 1100 is formed of a system-on-chip (SoC). The processor 1100 may be a general purpose processor used in a personal computer, a specific-purpose processor used in a specific-purpose computer, or an application processor used in a mobile computing device.

The memory 1200 communicates with the processor 1100. The memory 1200 may be a working memory of the processor 1100 or the computing device 1000. The processor 1100 stores codes or data temporarily. The processor 1100 executes codes using the memory 1200 to process data. The processor 1100 executes a variety of software, such as, but not limited to, an operating system and an application, using the memory 1200. The processor 1100 controls an overall operation of the computing device 1000 using the memory 1200. The memory 1200 may include a volatile memory such as, but not limited to, a static RAM, a dynamic RAM, a synchronous DRAM, and so on or a nonvolatile memory such as, but not limited to, a flash memory, a Phase-change RAM (PRAM), a Magnetic RAM (MRAM), a Resistive RAM (RRAM), a Ferroelectric RAM (FRAM), and so on.

The storage 1300 communicates with the processor 1100. The storage 1300 is used to store data for a long time. That is, the processor 110 stores data for a long time in the storage 1300. The storage 1300 stores a boot image for driving the computing device 1000. The storage 1300 stores source codes of a variety of software, such as an operating system and an application. The storage 1300 stores data that is processed by a variety of software, such as an operating system and an application.

In example embodiments, the processor 1100 drives a variety of software, such as an operating system and an application, by loading source codes stored in the storage 1300 onto the memory 1200 and executing codes loaded onto the memory 1220. The processor 1100 loads source codes stored in the storage 1300 onto the storage 1300 and process data loaded onto the memory 1200. The processor 1100 stores data for a long time of data stored in the memory 1200.

The storage 1300 includes a nonvolatile memory, such as, but not limited to, a flash memory, a PRAM (Phase-change RAM), an MRAM (Magnetic RAM), an RRAM (Resistive RAM), an FRAM (Ferroelectric RAM), and so on.

The storage 1300 includes a storage module 300 described with reference to FIG. 26. If the storage module 300 described with reference to FIG. 26 is applied to the computing device 1000, such a speed that the processor 1100 writes data at the storage 1300 may be markedly improved. Thus, operating performance of the computing device 1000 may be improved.

The modem 1400 communicates with an external device according to a control of the processor 1100. For example, the modem 1400 communicates with the external device in a wire or wireless manner. The modem 1400 may communicate based on at least one of wireless communications manners, such as, but not limited to, LTE (Long Term Evolution), WiMax, GSM (Global System for Mobile communication), CDMA (Code Division Multiple Access), Bluetooth, NFC (Near Field Communication), WiFi, RFID (Radio Frequency Identification, and so on or wire communications manners, such as, but not limited to, USB (Universal Serial Bus), SATA (Serial AT Attachment), SCSI (Small Computer Small Interface), Firewire, PCI (Peripheral Component Interconnection), and so on.

The user interface 1500 communicates with a user according to a control of the processor 1100. For example, the user interface 1500 may include, but not limited to, user input interfaces such as a keyboard, a keypad, a button, a touch panel, a touch screen, a touch pad, a touch ball, a camera, a microphone, a gyroscope sensor, a vibration sensor, and so on. The user interface 1500 may further include, but not limited to, user output interfaces such as an LCD, an OLED (Organic Light Emitting Diode) display device, an AMOLED (Active Matrix OLED) display device, an LED, a speaker, a motor, and so on.

The computing device 1000 may be a mobile computing device, such as, but not limited to, a smart phone, a smart pad, or a smart camera. The computing device 1000 may be a device, such as, but not limited to, a personal computer, a notebook computer, or a smart television.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A method of programming a nonvolatile memory, the nonvolatile memory including a plurality of memory cells and a plurality of bit lines respectively connected to the plurality of memory cells, the method comprising:
    loading data to the nonvolatile memory for a first program operation;
    starting the first program operation on the plurality of memory cells, based on the loaded data; and
    loading at least two page data to the nonvolatile memory, the at least two page data including first page data and second page data for a second program operation following the first program operation, before the first program operation is completed, and
    the first page data and the second page data respectively corresponding to a first bit and a second bit to be programmed at a memory cell among the plurality of memory cells.

2. The method of claim 1, wherein
    the nonvolatile memory further includes a plurality of first data latches respectively connected to the plurality of bit lines, a plurality of second data latches respectively connected to the plurality of bit lines, and a plurality of cache latches respectively connected to the plurality of bit lines, and
    the loading data to the nonvolatile memory for the first program operation includes loading the data to the plurality of cache latches and dumping the data loaded onto the cache latches onto the first data latches.

3. The method of claim 2, wherein the starting the first program operation is performed based on the data dumped onto the first data latches.

4. The method of claim 2, wherein the loading the at least two page data includes:
    loading the first page data onto the cache latches during the first program operation; and
    dumping the first page data loaded onto the cache latches onto the second data latches.

5. The method of claim 4, wherein the loading at least two page data further includes
    loading the second page data onto the cache latches after the first page data is dumped onto the second data latches.

6. The method of claim 5, further comprising:
    dumping the second page data loaded onto the cache latches onto the first data latches after the first program operation is ended; and
    after the second page data is dumped onto the first data latches, starting the second program operation based on the second page data dumped onto the first data latches and the first page data dumped onto the second data latches.

7. The method of claim 2, wherein
    the nonvolatile memory further includes a plurality of third data latches respectively connected to the plurality of bit lines, and a plurality of fourth data latches respectively connected to the plurality of bit lines,
    the loading the at least two page data further includes,
        loading the first page data onto the cache latches during the first program operation,
        dumping the first page data loaded onto the cache latches onto the fourth data latches,
        loading the second page data onto the cache latches during the first program operation, and
        dumping the second page data loaded onto the cache latches onto the third data latches during the first program operation.

8. The method of claim 7, further comprising:
    after the first program operation ends, starting the second program operation based on the second page data dumped onto the third data latches and the first page data dumped into the fourth data latches.

9. The method of claim 2, wherein
    the nonvolatile memory further includes a plurality of third data latches respectively connected to the plurality of bit lines,
    the loading at least two page data further includes,
        loading the first page data onto the cache latches and dumping the first page data loaded onto the cache latches onto the second data latch before the first program operations ends,
        loading the second page data onto the cache latches before the first program operation ends,
        dumping the second page data loaded onto the cache latches onto the third data latches before the first program operation ends,
        loading third page data for the second program operation onto the cache latches before the first program operation ends, and
        dumping the third page data loaded onto the cache latches onto the first data latches after the first program operation ends, and
    the method further comprises after the third page data is dumped, starting the second program operation based on the third page data dumped onto the first data latches, the first page data dumped into the second data latches, and the second page data dumped into the third data latches.

10. A memory system comprising:
    a nonvolatile memory including a plurality of memory cells, a plurality of bit lines connected to the memory cells, a plurality of data latches respectively connected to the plurality of bit lines, and a plurality of cache latches corresponding to the plurality of bit lines; and
    a memory controller,
        the memory controller being configured to transmit data to be programmed at the memory cells and to control the nonvolatile memory such that the data is programmed at the memory cells,
        the memory controller being configured to select one of a normal mode and a dump mode,
        during the normal mode, the memory controller being configured to transmit page data for a second program operation to the nonvolatile memory before a first program operation of the nonvolatile memory is completed, the second program operation following the first program operation,
        during the dump mode, the memory controller being configured to transmit the page data for the second program operation to the nonvolatile memory together with a dump command before the first program operation of the nonvolatile memory is completed, and the nonvolatile memory being configured to store the page data received from the memory controller in the cache latches and to dump the page data stored in the cache latches onto the data latches when the dump command is received from the memory controller before the first program operation of the nonvolatile memory is completed.

11. The memory system of claim 10, wherein
the plurality of memory cells include first memory cells and second memory cells,
the memory controller is configured to program i bits at each of the first memory cells of the plurality of memory cells and j bits at each of the second memory cells of the plurality of memory cells,
i and j are integers,
j is less than i, and
the memory controller is configured to select the normal mode when the first program operation is performed at the first memory cells and to select the dump mode when the first program operation is performed at the second memory cells.

12. The memory system of claim 11, wherein
the nonvolatile memory includes a plurality of memory blocks,
the first memory cells are included in a first memory block of the plurality of memory blocks,
the second memory cells are included in a second memory block of the plurality of memory blocks, and
the nonvolatile memory is configured to be erased by a unit of one memory block.

13. The memory system of claim 10, wherein
the memory controller is configured to select the normal mode when the data latches connected to the plurality of bit lines does not include at least one data latch in which data is not stored during the first program operation, and
the memory controller is configured to select the dump mode when the data latches connected to the plurality of bit lines include at least one data latch in which data is not stored during the first program operation.

14. The memory system of claim 10, wherein
the nonvolatile memory has a plurality of dump points during the first program operation, and
when the dump command is received from the memory controller during the first program operation, the nonvolatile memory dumps the page data stored in the cache latches onto the data latches at a dump point being the first to arrive.

15. The memory system of claim 14, wherein
the plurality of dump points are points among a plurality of program loops of the programming, and
in each program loop, a verification voltage is applied after a program voltage is applied to the plurality of memory cells.

16. A method of programming a nonvolatile memory, the nonvolatile memory including a plurality of memory cells connected to a page buffer circuit through a plurality of bit lines, respectively, the method comprising:
loading at least one page data for an upcoming program operation to the page buffer circuit;
starting the upcoming program operation, the upcoming program operation including transferring the at least one page data for the upcoming program operation loaded onto the page buffer circuit to the plurality of memory cells; and
loading at least two page data for a following program operation to the page buffer circuit, the loading the at least two page data for the following program operation including loading first page data and second page data for the following program operation to the page buffer circuit before the upcoming program operation is completed,
the following program operation being scheduled for after the upcoming program operation, and
the first page data and the second page data for the following program operation respectively corresponding to a first bit and a second bit to be programmed in at least one of the plurality of memory cells.

17. The method of claim 16, wherein
the page buffer circuit includes a plurality of page buffers connected to the plurality of bit lines, respectively,
each page buffer includes a cache latch connected to a plurality of data latches,
the loading the at least one page data for the upcoming program operation to the page buffer circuit includes loading each bit of the at least one page data for the upcoming program operation to the cache latch of each page buffer and dumping each bit of the at least one page data for the upcoming program operation from the cache latch onto one of the data latches in each page buffer before the starting the upcoming program operation, and
the loading the at least two page data for the following program operation further includes loading each bit of the first page data for the following program operation to the cache latch of each page buffer after starting the upcoming program operation and before the upcoming program operation is completed.

18. The method of claim 17, further comprising:
determining whether a free data latch exists in the plurality of data latches in each page buffer before the upcoming program operation is completed,
wherein
if the free data latch exists, the loading the at least one page of data for the following program operation further includes,
dumping each bit of the loaded first page data for the following program operation from the cache latch onto the free data latch in each page buffer before the upcoming program operation is completed, and
loading each bit of the second page data for the following program operation to the cache latch of each page buffer after the dumping each bit of the loaded first page data for the following program operation and before the upcoming program operation is completed, and
if the free data latch does not exist, the loading the at least two page data for the following program operation further includes dumping each bit of the loaded first page of data for the following program operation from the cache latch onto one of the data latches in each page buffer after the upcoming program operation is completed, and
the second page data for the following program operation corresponds to second bit to be programmed at one of the plurality of memory cells.

19. The method of claim 16, wherein
the page buffer circuit includes a page buffer,
the page buffer includes a cache latch and a plurality of data latches connected to each other,
before the starting the upcoming program operation, the loading the at least one page data for the upcoming program operation to the page buffer circuit includes loading third page data for the upcoming program operation to the cache latch, dumping the loaded third page data for the upcoming program operation from the cache latch onto one of the plurality of data latches, loading fourth page data for the upcoming program operation to the cache latch after the dumping the third page of data for the upcoming program operation, and dumping the loaded fourth page data for the upcoming program operation from the cache latch onto a different one of the plurality of data latches, the method further includes determining whether a free data latch exists among the plurality of data latches after starting the upcoming program operation and before the upcoming program operation is completed, and the loading the at least two page data for the following program operation includes, loading the first page data for the following program operation to the cache latch after starting the upcoming program operation, and one of if the free data latch exists, dumping the loaded first page data for the following program operation from the cache latch onto the free data latch before the upcoming program operation is completed, and if the free data latch does not exist, dumping the loaded first page data for the following program operation from the cache latch to a first available one of the plurality of data latches after the upcoming program operation is completed.

20. The method of claim 16, wherein the nonvolatile memory includes a plurality of strings arranged in rows and columns on a substrate, and each string includes a number of the plurality of memory cells stacked on top of each other between at least one ground selection transistor and at least one string selection transistor along a direction perpendicular to the substrate.

\* \* \* \* \*